US007920665B1

(12) United States Patent
Lombaard

(10) Patent No.: US 7,920,665 B1
(45) Date of Patent: Apr. 5, 2011

(54) SYMMETRICAL RANGE CONTROLLER CIRCUIT AND METHOD

(75) Inventor: Carel J. Lombaard, Wonderboom South (ZA)

(73) Assignee: Cypress Semiconductor Corporation, San Jose, CA (US)

( * ) Notice: Subject to any disclaimer, the term of this patent is extended or adjusted under 35 U.S.C. 154(b) by 763 days.

(21) Appl. No.: 11/541,000

(22) Filed: Sep. 28, 2006

Related U.S. Application Data

(60) Provisional application No. 60/721,668, filed on Sep. 28, 2005, provisional application No. 60/721,688, filed on Sep. 28, 2005.

(51) Int. Cl.
H04L 7/00 (2006.01)
H04L 25/00 (2006.01)
H04L 25/40 (2006.01)

(52) U.S. Cl. ......... 375/371; 375/372; 375/373; 377/118
(58) Field of Classification Search .......... 375/371–373; 377/118
See application file for complete search history.

(56) References Cited

U.S. PATENT DOCUMENTS

| 4,061,987 | A |   | 12/1977 | Nagahama |
|---|---|---|---|---|
| 4,075,569 | A | * | 2/1978  | Wright .......................... 327/175 |
| 4,378,509 | A |   | 3/1983  | Hatchett et al. |
| 4,492,934 | A |   | 1/1985  | Sugimoto |
| 4,535,459 | A |   | 8/1985  | Hogge, Jr. |
| 4,588,968 | A |   | 5/1986  | Wile |
| 4,593,254 | A |   | 6/1986  | Coburn |
| 4,594,564 | A |   | 6/1986  | Yarborough, Jr. |
| 4,617,678 | A | * | 10/1986 | Devensky et al. ............ 375/349 |
| 4,773,085 | A |   | 9/1988  | Cordell |
| 4,787,097 | A |   | 11/1988 | Rizzo |
| 4,855,683 | A |   | 8/1989  | Troudet et al. |
| 4,926,447 | A |   | 5/1990  | Corsetto et al. |
| 4,940,952 | A |   | 7/1990  | Kegasa |
| 4,943,788 | A |   | 7/1990  | Laws et al. |
| 5,003,599 | A |   | 3/1991  | Landry |
| 5,005,191 | A |   | 4/1991  | O'Connor |
| 5,010,559 | A |   | 4/1991  | O'Connor |
| 5,022,056 | A |   | 6/1991  | Henderson et al. |
| 5,101,203 | A |   | 3/1992  | Gersbach et al. |
| 5,120,990 | A |   | 6/1992  | Koker |
| 5,138,281 | A |   | 8/1992  | Boudewijns |
| 5,175,767 | A |   | 12/1992 | Landry |
| 5,197,086 | A |   | 3/1993  | Jackson et al. |
| 5,301,196 | A |   | 4/1994  | Ewen et al. |
| 5,367,544 | A |   | 11/1994 | Bruekheimer |
| 5,384,551 | A |   | 1/1995  | Kennedy et al. |
| 5,418,497 | A |   | 5/1995  | Martin |

(Continued)

OTHER PUBLICATIONS

Fouzar et al., "Very Short Locking Time PLL Based on Controlled Gain Technique," ICECS 2000—IEEE International Conference on Electronics, Circuits and Systems, Dec. 17-20, 2000, vol. 1, pp. 252-255; 4 pages.

(Continued)

Primary Examiner — Curtis B Odom

(57) ABSTRACT

A symmetrical range controller for phase-locked loop circuits includes a first counter coupled to a first signal line, where the first counter is configured to count state transition edges of the first signal, inhibit logic coupled to the first counter, where the inhibit logic is configured to inhibit an output signal of a second counter in response to a predetermined count of the first counter, and reset logic coupled to the first counter, where the reset logic is configured to reset the second counter in response to a full count of the first counter.

7 Claims, 25 Drawing Sheets

U.S. PATENT DOCUMENTS

| | | | |
|---|---|---|---|
| 5,436,938 | A | 7/1995 | Pigeon |
| 5,487,093 | A | 1/1996 | Adresen et al. |
| 5,506,875 | A | 4/1996 | Nuckolls et al. |
| 5,512,860 | A | 4/1996 | Huscroft et al. |
| 5,539,345 | A | 7/1996 | Hawkins |
| 5,548,251 | A | 8/1996 | Chou et al. |
| 5,574,756 | A | 11/1996 | Jeong |
| 5,598,424 | A | 1/1997 | Erickson et al. |
| 5,608,734 | A | 3/1997 | Sandler et al. |
| 5,614,855 | A | 3/1997 | Lee et al. |
| 5,652,531 | A | 7/1997 | Co et al. |
| 5,661,763 | A | 8/1997 | Sands |
| 5,663,665 | A | 9/1997 | Wang et al. |
| 5,666,547 | A | 9/1997 | James et al. |
| 5,671,223 | A | 9/1997 | Shachar et al. |
| 5,694,056 | A | 12/1997 | Mahoney et al. |
| 5,694,088 | A | 12/1997 | Dickson |
| 5,712,580 | A | 1/1998 | Baumgartner et al. |
| 5,719,908 | A | 2/1998 | Greeff et al. |
| 5,731,723 | A | 3/1998 | Chen |
| 5,739,709 | A | 4/1998 | Banno |
| 5,754,080 | A | 5/1998 | Chen et al. |
| 5,757,297 | A | 5/1998 | Ferraiolo et al. |
| 5,777,567 | A | 7/1998 | Murata et al. |
| 5,778,000 | A | 7/1998 | Dosiere et al. |
| 5,789,947 | A | 8/1998 | Sato |
| 5,790,607 | A | 8/1998 | Burke et al. |
| 5,799,048 | A | 8/1998 | Farjad-Rad et al. |
| 5,808,498 | A | 9/1998 | Donnelly et al. |
| 5,825,209 | A | 10/1998 | Stark et al. |
| 5,834,950 | A | 11/1998 | Co et al. |
| 5,838,631 | A | 11/1998 | Mick |
| 5,838,749 | A | 11/1998 | Casper et al. |
| 5,854,794 | A | 12/1998 | Pawlowski |
| 5,910,753 | A | 6/1999 | Bogdan |
| 5,926,041 | A | 7/1999 | Duffy et al. |
| 5,933,031 | A | 8/1999 | Konno |
| 5,936,430 | A | 8/1999 | Patterson |
| 5,939,901 | A | 8/1999 | Geddes |
| 5,950,115 | A | 9/1999 | Momtaz et al. |
| 5,953,386 | A | 9/1999 | Anderson |
| 5,955,906 | A | 9/1999 | Yamaguchi |
| 5,960,007 | A | 9/1999 | Grivna |
| 5,963,058 | A | 10/1999 | Thomas |
| 5,963,059 | A | 10/1999 | Partovi et al. |
| 5,969,552 | A | 10/1999 | Lee et al. |
| 5,977,801 | A | 11/1999 | Boerstler |
| 6,014,042 | A | 1/2000 | Nguyen |
| 6,026,134 | A | 2/2000 | Duffy et al. |
| 6,041,090 | A | 3/2000 | Chen |
| 6,055,286 | A | 4/2000 | Wu et al. |
| 6,060,953 | A | 5/2000 | Tsai |
| 6,064,235 | A | 5/2000 | Hayashi et al. |
| 6,075,388 | A | 6/2000 | Dalmia |
| 6,075,416 | A | 6/2000 | Dalmia |
| 6,081,572 | A | 6/2000 | Filip |
| 6,088,331 | A * | 7/2000 | Beshai et al. ................. 370/232 |
| 6,100,722 | A | 8/2000 | Dalmia |
| 6,147,530 | A | 11/2000 | Nogawa |
| 6,194,928 | B1 | 2/2001 | Heyne |
| 6,197,229 | B1 | 3/2001 | Cho |
| 6,255,880 | B1 | 7/2001 | Nguyen |
| 6,265,996 | B1 | 7/2001 | Duffy |
| 6,307,413 | B1 | 10/2001 | Dalmia et al. |
| 6,310,521 | B1 | 10/2001 | Dalmia |
| 6,366,135 | B1 | 4/2002 | Dalmia et al. |
| 6,404,833 | B1 | 6/2002 | Takebe |
| 6,535,527 | B1 | 3/2003 | Duffy |
| 6,542,041 | B2 | 4/2003 | Choi |
| 6,909,329 | B2 | 6/2005 | Jasa et al. |
| 6,940,356 | B2 | 9/2005 | McDonald et al. |
| 7,061,330 | B2 | 6/2006 | Kegasa et al. |
| 7,151,413 | B2 | 12/2006 | Lin |
| 7,375,593 | B2 | 5/2008 | Self |
| 7,439,816 | B1 | 10/2008 | Lombaard |
| 7,443,206 | B1 | 10/2008 | Fernandez |
| 7,443,761 | B2 | 10/2008 | Lin |
| 7,538,591 | B2 | 5/2009 | Oh |

OTHER PUBLICATIONS

Fouzar et al., "A New Fully Integrated CMOS Phase-Locked Loop with Low Jitter and Fast Lock Time," ISCAS 2000—IEEE International Conference on Electronics, Circuits and Systems, May 28-31, 2000, vol. 2, pp. 253-256; 4 pages.

Wikipedia, the free encyclopedia, "Phase-Locked Loop," <http://en.wikipedia.org/wiki/Phase-locked_loop>, May 29, 2006; 10 pages.

"1.8V, 500-MHz, 10-Output JEDEC-Compliant Zero Delay Buffer," Cypress Advance Information, Feb. 12, 2004; 9 pages.

U.S. Appl. No. 09/301,900: "Low Latency, Low Power Deserializer," Michael dully, Filed Apr. 29, 1999; 47 pages.

U.S. Appl. No. 08/976,072: "Circuits and Methods for Framing One or More Data Streams," Edward Grivna, filed Nov. 21, 1997; 39 pages.

U.S. Appl. No. 08/879,287: "Phase Detector with Linear Output Response," Navabi et al., filed Jun. 19, 1997; 14 pages.

U.S. Appl. No. 09/302,214: "Clock and Data Recovery PLL Based on Parallel Architecture," Kamal Dalmia, filed Apr. 29, 1999; 21 pages.

U.S. Appl. No. 09/302,213: "Phase Detector with Extended Linear Range," Kamal Dalmia, filed Apr. 29, 1999; 16 pages.

U.S. Appl. No. 09/217,465: "Phase Detector with Extended Linear Range," Dalmia et al., filed Apr. 29, 1999; 23 pages.

USPTO Non-Final Rejection for U.S. Appl. No. 11/731,606 dated Oct. 15, 2008; 11 pages.

USPTO Notice of Allowance for U.S. Appl. No. 11/731,606 dated Sep. 24, 2009; 6 pages.

USPTO Non-Final Rejection for U.S. Appl. No. 08/878,714 dated Jan. 6, 1999; 8 pages.

USPTO Non-Final Rejection for U.S. Appl. No. 11/731,606 dated Mar. 24, 2009; 17 pages.

USPTO Final Rejection for U.S. Appl. No. 08/878,714 dated Jun. 18, 1999; 9 pages.

USPTO Notice of Allowance for U.S. Appl. No. 11/731,606 dated Feb. 5, 2010; 6 pages.

USPTO Notice of Allowance for U.S. Appl. No. 11/541,025 dated Jun. 13, 2008; 6 pages.

USPTO Non-Final Rejection for U.S. Appl. No. 11/541,025 dated Jan. 22, 2008; 6 pages.

Fouzar et al., "Very Short Locking Time PLL Based on Controlled Gain Technique," ICECS 2000—IEEE International Conference on Electronics, Circuits and Systems, Dec. 2000, vol. 1, pp. 252-255; 4 pages.

Fouzer et al., "A New Fully Integrated CMOS Phase-loocked Loop with Low Jitter and Fast Lock Time," ISCAS 2000—IEEE International Conference on Electronics, Circuits and Systems, May 2000, vol. 2, pp. 253-256; 4 pages.

"Phase-Locked Loop," <http://en.wikipedia.org/wiki/Phase-locked_loop>, May 29, 2006; 10 pages.

"1.8V, 500MHz, 10-Output JEDEC-Compliant Zero Delay Buffer," Cypress Advanced Information, Feb. 12, 2004; 9 pages.

USPTO Notice of Allowance for U.S. Appl. No. 08/878,714 dated Sep. 27, 1999; 6 pages.

USPTO Restriction Requirement for U.S. Appl. No. 09/301,900 dated Aug. 23, 2000; 2 pages.

USPTO Notice of Allowance for U.S. Appl. No. 11/818,740 dated Feb. 19, 2010; 7 pages.

USPTO Notice of Allowance for U.S. Appl. No. 11/818,740 dated Oct. 21, 2009; 7 pages.

USPTO Final Rejection for U.S. Appl. No. 11/818,740 dated Jul. 23, 2009; 12 pages.

USPTO Non-Final Rejection for U.S. Appl. No. 11/818,740 dated Jan. 13, 2009; 17 pages.

USPTO Notice of Allowance for U.S. Appl. No. 09/283,058 dated Feb. 11, 2000; 1 page.

USPTO Notice of Allowance for U.S. Appl. No. 09/302,193 dated Oct. 21, 2002; 7 pages.

USPTO Non-Final Rejection for U.S. Appl. No. 09/302,193 dated May 8, 2002; 10 pages.

USPTO Notice of Allowance for U.S. Appl. No. 09/471,915 dated Jan. 9, 2001; 3 pages.

USPTO Non-Final Rejection for U.S. Appl. No. 09/471,915 dated Jun. 18, 2001; 4 pages.

USPTO Non-Final Rejection for U.S. Appl. No. 09/471,915 dated Jan. 19, 2001; 4 pages.
USPTO Notice of Allowance for U.S. Appl. No. 09/471,914 dated Mar. 17, 2001; 3 pages.
USPTO Non-Final Rejection for U.S. Appl. No. 09/471,914 dated Feb. 1, 2001; 6 pages.
USPTO Notice of Allowance for U.S. Appl. No. 11/001,992 dated Oct. 5, 2006; 6 pages.
USPTO Non-Final Rejection for U.S. Appl. No. 11/643,183 dated Nov. 27, 2009; 11 pages.
USPTO Non-Final Rejection for U.S. Appl. No. 11/541,025 dated Jan. 22, 2008; 6 pages.
USPTO Notice of Allowance for U.S. Appl. No. 09/471,576 dated Jun. 27, 2001; 1 page.
USPTO Non-Final Rejection for U.S. Appl. No. 09/471,576 dated Apr. 16, 2001; 3 pages.
Wang et al., "A 1Gb/s CMOS Clock and Data Recovery Circuit," 1999 IEEE International Solid-State Circuits Conference, Feb. 1999, pp. 354-355; 2 pages.
U.S. Appl. No. 09/471,915: "Data Frequency Detector," Dalmia et al., filed on Dec. 23, 1999; 22 pages.
U.S. Appl. No. 09/471,914: "Reference-Free Clock Generator and Data Recovery," Kamal Dalmia, filed on Dec. 23, 1999; 28 pages.
U.S. Appl. No. 09/470,665: "Digital Phase/Frequency Detector, and Clock Generator and Data Recovery PLL Containing the Same," Kamal Dalmia, filed on Dec. 23, 1999; 22 pages.
USPTO Notice of Allowance for U.S. Appl. No. 09/471,915 dated Oct. 19, 2001; 3 pages.
USPTO Non-Final Rejection for U.S. Appl. No. 09/471,915 dated Jun. 18, 2001; 4 pages.
USPTO Non-Final Rejection for U.S. Appl. No. 09/471,915 dated Jan. 19, 2001; 4 pages.
USPTO Notice of Allowance for U.S. Appl. No. 09/471,914 dated Mar. 27, 2001; 3 pages.
USPTO Non-Final Rejection for U.S. Appl. No. 09/471,914 dated Feb. 1, 2001; 6 pages.
USPTO Notice of Allowance for U.S. Appl. No. 09/470,665 dated Sep. 24, 2003; 4 pages.
USPTO Non-Final Rejection for U.S. Appl. No. 09/470,665 dated Apr. 25, 2003; 6 pages.
USPTO Non-Final Rejection for U.S. Appl. No. 09/470,665 dated Nov. 21, 2002; 4 pages.
USPTO Notice of Allowance for U.S. Appl. No. 09/283,058 dated Feb. 11, 2000; 1 page.
USPTO Notice of Allowance for U.S. Appl. No. 09/362,478 dated Mar. 28, 2000; 5 pages.
USPTO Notice of Allowance for U.S. Appl. No. 09/302,213 dated Feb. 9, 2000; 4 pages.
USPTO Notice of Allowance for U.S. Appl. No. 09/302,214 dated Oct. 31, 2000; 2 pages.
USPTO Non-Final Rejection for U.S. Appl. No. 09/302,214 dated Aug. 2, 2000; 4 pages.
USPTO Non-Final Rejection for U.S. Appl. No. 09/347,829 dated Jul. 28, 2000; 1 page.
USPTO Non-Final Rejection for U.S. Appl. No. 09/347,829 dated Apr. 20, 2000; 4 pages.
Sheen et al., "A 3.3 V 600MHZ—1.30 GHZ CMOS Phase-Locked Loop for Clock Synchronization of Optical Chip-to-Chip Interconnects," Mar. 1998, IEEE ISCAS, Circuits and Systems, vol. 4, pp. 429-432; 4 pages.

USPTO Notice of Allowance for U.S. Appl. No. 08/879,287 dated Dec. 21, 1998; 4 pages.
USPTO Non-Final Rejection for U.S. Appl. No. 08/879,287 dated Nov. 3, 1998; 5 pages.
USPTO Non-Final Rejection for U.S. Appl. No. 08/879,287 dated Aug. 17, 1998; 6 pages.
Yang et al., "A 0.8-um CMOS 2.5 Gb/s Oversampling Receiver and Transmitter for Serial Links," IEEE Journal of Solid-State Circuits, vol. 31, No. 12, Dec. 1996, pp. 2015-2023; 9 pages.
Chen et al., "FP 15.3: A 1.25Gb/s, 460mW CMOS Transceiver for Serial Data Communication," Feb. 1997, IEEE International Solid-State Circuits Conference, pp. 242-243, 190-191, 422; 5 pages.
Fiedler et al., "FP 15.1: A 1.0625Gbps Transceiver with 2x-Oversampling and Transmit Signal Pre-Emphasis," Feb. 1997, IEEE International Solid-State Circuits Conference, pp. 238-239, 186-187, 420; 5 pages.
U.S. Appl. No. 08/878,714 "Phase Locked Loop (PLL) with Linear Parallel Sampling Phase Detector," Navabi et al., filed Jun. 19, 1997; 26 pages.
Yang et al., "A 0.8-um CMOS 2.5 Gb/s Oversampled Receiver for Serial Links," IEEE Journal of Solid-State Circuits, Feb. 1996, pp. 200-201; 2 pages.
USPTO Notice of Allowance for U.S. Appl. No. 08/564,597 dated Jan. 16, 1997; 2 pages.
USPTO Non-Final Rejection for U.S. Appl. No. 08/564,597 dated Aug. 7, 1996; 4 pages.
Johnson et al., "A Variable Delay Line PLL for CPU-Coprocessor Synchronization," Oct. 1988, IEEE Journal of Solid-State Circuits, vol. 23, No. 5, pp. 1218-1223; 6 pages.
Bazes et al., "A Novel CMOS Digital Clock and Data Decoder," Dec. 1992, IEEE Journal of Solid-State Circuits, vol. 27, No. 12, pp. 1934-1940; 7 pages.
USPTO Notice of Allowance for U.S. Appl. No. 09/586,646 dated Dec. 19, 2000; 3 pages.
USPTO Notice of Allowance for U.S. Appl. No. 09/216,465 dated Feb. 9, 2000; 4 pages.
USPTO Notice of Allowance for U.S. Appl. No. 09/302,193 dated Oct. 21, 2002; 7 pages.
USPTO Non-Final Rejection for U.S. Appl. No. 09/302,193 dated May 8, 2002; 10 pages.
USPTO Non-Final Rejection for U.S. Appl. No. 09/301,900 dated Nov. 28, 2000; 4 pages.
USPTO Notice of Allowance for U.S. Appl. No. 09/301,900 dated Mar. 12, 2001; 2 pages.
USPTO Requirement for Restriction/Election for U.S. Appl. No. 09/301,900 dated Aug. 23, 2000; 2 pages.
USPTO Notice of Allowance for U.S. Appl. No. 08/796,072 dated Jul. 6, 1999; 4 pages.
USPTO Non-Final Rejection for U.S. Appl. No. 08/796,072 dated May 11, 1999; 7 pages.
USPTO Notice of Allowance for U.S. Appl. No. 08/975,644 dated May 11, 1999; 2 pages.
USPTO Final Rejection for U.S. Appl. No. 08/975,644 dated Mar. 29, 1999; 6 pages.
USPTO Non-Final Rejection for U.S. Appl. No. 08/975,644 dated Oct. 27, 1998; 5 pages.
Cypress HOTLink Transmitter/REceiver, CY7B923/CY7B933, Apr. 1999, pp. 1-35; 35 pages.

* cited by examiner

SYMMETRICAL RANGE CONTROLLER CIRCUIT AND METHOD

RELATED APPLICATIONS

This application claims the benefit of U.S. Provisional Application No. 60/721,668, filed on Sep. 28, 2005, and U.S. Provisional Application No. 60/721,688, filed on Sep. 28, 2005.

TECHNICAL FIELD

Embodiments of the present invention relate to frequency detection and, more particularly, to range control in frequency detection.

BACKGROUND

Phase-Locked Loop (PLL) circuits are widely used in computer and data communication systems. For example, in one common application, a PLL circuit generates a common clocking signal for distribution to several system components. The common clocking signal ensures system synchronization for reduced system errors and improved efficiency. Such circuits are commonly called Zero Delay Buffer (ZDB) circuits.

Another common application for PLL circuits is data communications. For example, a data signal demodulator uses a PLL to recover clock and data signals transmitted through a transmission line or wireless medium. The PLL in a transmission system typically cleans noise and jitter from the data and clock signals, and facilitates synchronization of the internal clocks of the transmit and receive systems.

One common problem facing designers of PLL circuits is the amount of time that it takes to synchronize or lock a feedback (FB) signal with a reference (REF) signal. For example, certain communication systems may require synchronization of clock signals within a few milliseconds. Similarly, certain computer systems may require production of a clean version of a clock signal for distribution within a few cycles of the clock signal. As technology advances, processing speeds and data rates increase. These increases in system speed are driving clock frequencies higher and higher. Systems requiring clock signal synchronization within a few cycles require very responsive and precisely configured PLL circuits. In recent years, standard PLL circuit designs have not met the synchronization time requirements of some new systems.

FIG. 1 is a block diagram illustrating a conventional PLL circuit architecture. Such PLL circuits are commonly referred to as "charge pump PLL" circuits. A typical PLL circuit includes a phase-frequency detector (PFD), a charge pump (CP), a loop filter (illustrated by the series combination of a resistor, a capacitor, and ground), and a voltage controlled oscillator (VCO). Some common PLL circuits may also include one or more frequency dividers (e.g., a divide-by-N counter in the feedback loop), and other components which, for convenience, are not illustrated in FIG. 1.

In the depicted example of a common PLL circuit, the phase-frequency detector receives as inputs a reference clock signal and a feedback clock signal. The phase-frequency detector detects the difference in phase and frequency between the reference clock signal and the feedback clock signal and generates an output signal based on whether the feedback clock signal is lagging or leading the reference clock signal in phase. The phase-frequency detector provides this control signal to the charge pump. In response to the control signal, the charge pump generates a current flow with respect to the components of the loop filter. The control signal determines the magnitude and direction of the current flow, which either charges or drains the capacitor in the loop filter. The loop filter converts these signals to a control voltage that sets the VCO frequency. Based on the control voltage, the VCO oscillates at a higher or lower frequency, which affects the phase and frequency of the feedback clock signal. When the phases of the reference clock signal and the feedback clock signal are synchronized, the PLL is considered locked (i.e., phase locked).

One drawback of the PLL circuit illustrated in FIG. 1 is that the phase-frequency detector and charge pump do not efficiently charge the capacitor in the loop filter. For example, an "up" signal is sometimes cancelled by a "down" signal when only an up signal should have been applied. This reduces the net current flow and, hence, the efficiency of the PLL circuit. Thus, some inefficiency exists. Further, to avoid overshoot and to promote stability, the phase-frequency detector and charge pump may be configured to make relatively slow or subtle adjustments to the frequency and phase of the feedback clock signal. Although the control voltage controls the frequency, and as a result controls the phase, the frequency is adjusted too slowly to lock to the reference signal within certain time constraints.

FIG. 2 illustrates a conventional PLL, which includes a frequency detector (FD). Other conventional methods of reducing lock time in a PLL typically include increasing the bandwidth of the PLL, or implementing some method of frequency detection to control a programmable gain charge pump that is driven by the phase-frequency detector, as discussed, for example, in Y. Fouzar, M. Sawan, Y. Savaria, "Very short locking time PLL based on controlled gain technique", *ICECS 2000—IEEE International Conference on Electronics, Circuits and Systems,* 17-20 Dec. 2000, Volume 1, pp. 252-255.

Another conventional method of reducing lock time involves controlling the VCO control voltage using matched frequency-to-voltage converters and so-called "coarse control loop," as discussed in Y. Fouzar, M. Sawan, Y. Savaria, "A New Fully Integrated CMOS Phase-Locked Loop with Low Jitter and Fast Lock Time", *ISCAS2000—IEEE International Symposium on Circuits and Systems,* 28-31 May 2000, Volume 2, pp. 253-256.

Another common method of reducing lock time involves constraining the VCO control voltage to some open-loop, predefined value by pre-charging the loop filter capacitor. However, such a predefined value may not match well with the voltage required for the VCO to produce the frequency as required by the input frequency. In another conventional method, a lock detector increases the charge pump current (and, hence, the PLL bandwidth) if the reference and feedback clock signals are not locked.

Each of these conventional PLL circuits have inherent drawbacks which make them inadequate for systems requiring fast lock times and a high level of stability. In the cases where the PLL bandwidth is increased, there is an added risk of instability. Moreover, the problem of phase-frequency detector inefficiency is not adequately remedied in such systems. Where a frequency-to-voltage converter and analog controller are used, the controller typically needs to be optimized for each particular VCO that is used. Additionally, the frequency-to-voltage converters typically need to be matched. Such methods are inherently inefficient, error prone, and labor intensive. Considering that the frequency-to-voltage converter covers the entire range of operation, fine adjustments to phase and frequency are difficult to make with any measure of accuracy and stability.

One of the primary problems with conventional PLL solutions is instability in the output signal. As a PLL design is adjusted to reduce the time required for synchronization, certain designs may result in frequency overshoot and oscillations.

FIG. 3 illustrates a conventional range controller type frequency detector. The range controller receives a reference clock (RefCLK). The other clock is the recovered clock (Rx-CLK) generated by the VCO of a Clock&Data Recovery (CDR) PLL. A counter is provided for each clock. The counters are reset together and, at a certain point in the reference clock count, the RxCLK is sampled by the RefCLK domain. The values of the counters are compared and a decision is made to determine if the status is to be updated as "locked" or "unlocked" (i.e. the RxCLK is within a given range from the RefCLK).

The "inner" and "outer" windows are logic constructs used to implement deadzone and hysteresis. Some hysteresis is provided to allow the RxCLK to settle within the acceptable range from the RefCLK frequency. The hysteresis is defined explicitly so that only "in range" and "out of range" conditions are detected. The inner window is narrower and is used for transitioning from an out-of-range state to an in-range state, and the outer window is used for transitioning from the in-range state to the out-of-range state.

One problem associated with this conventional method is that there is no output signal to indicate whether the frequency of the RxCLK is above or below the frequency of RefCLK. This precludes its use in fast lock PLL circuits as a replacement for a phase-frequency detector, because fast lock PLL circuits typically implement a frequency detector that is capable of indicating the direction of adjustment. Furthermore, in the conventional method, it is presumed that both clock signals are always present. This assumption is not always accurate, especially during system startup when the VCO is initializing. For improved performance in fast lock applications, the range controller should not assert its outputs if either clock is absent, but should still function properly when both signals become available.

BRIEF DESCRIPTION OF THE DRAWINGS

The present invention is illustrated by way of example, and not by way of limitation, in the figures of the accompanying drawings in which.

DETAILED DESCRIPTION

Figure 1:
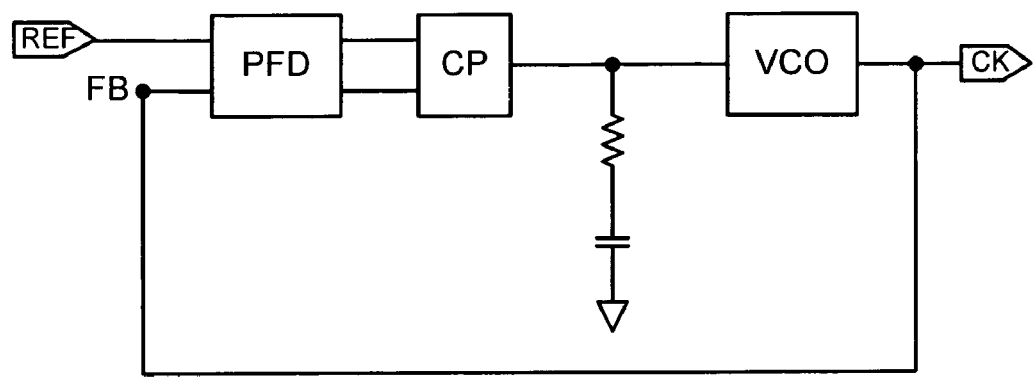
FIG. 1 illustrates a block diagram of a conventional phase-locked loop circuit.
Figure 2:
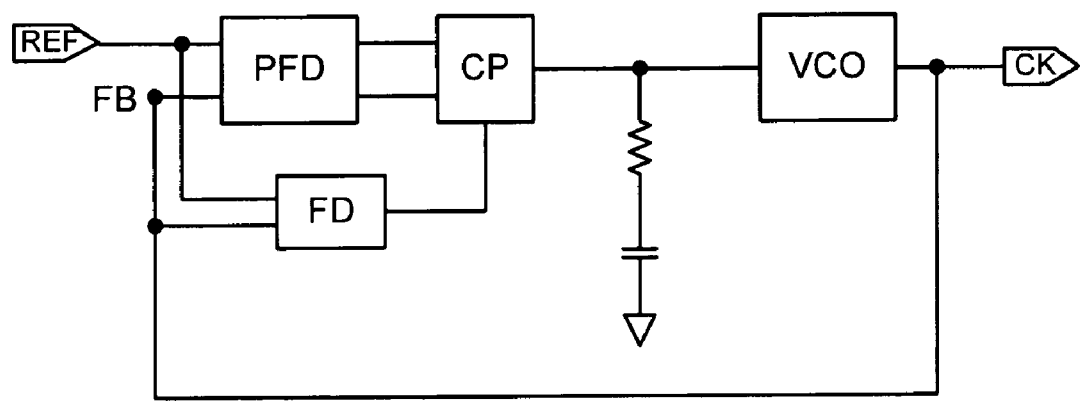
FIG. 2 illustrates a block diagram of a common improvement to a conventional phase-locked loop circuit.
Figure 3:
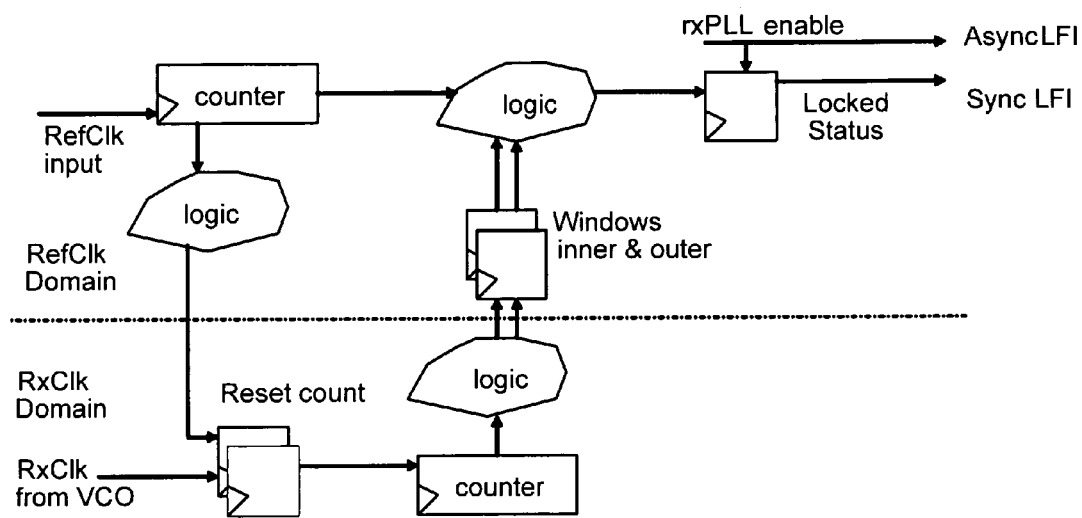
FIG. 3 illustrates a block diagram of a conventional frequency detector.

A fast lock PLL circuit is described. In the following description, numerous specific details are set forth, such as examples of specific system components, circuit topologies, method operations, etc., in order to provide a thorough understanding of embodiments of the present invention. It will be apparent, nevertheless, to one skilled in the art that embodiments of present invention may be practiced without these specific details. In other instances, well known components or methods have not been described in detail but rather in a block diagram in order to avoid unnecessarily obscuring the present invention. Thus, the specific details set forth are merely exemplary. The specific details may be varied from and still be contemplated to be within the spirit and scope of the present invention.

The following detailed description includes circuits, which will be described below. Alternatively, the operations of the circuits may be performed by a combination of hardware, firmware, and software. Interconnection between circuit components or blocks may be shown as buses or as individual signal lines. Each of the buses may alternatively be one or more individual signal lines, and each of the individual signal lines may alternatively be buses.

An apparatus and method are described for a fast locking PLL and an associated symmetrical range controller. In one embodiment, the method includes detecting a phase and a frequency of a first signal and a phase and a frequency of a second signal in a phase-locked loop circuit. Additionally, the method includes adjusting the frequency of the second signal in a first control element until the frequency of the second signal is within a predetermined range of the frequency of the first signal. The method also includes tuning the phase and the frequency of the second signal in a second control element until the phase and the frequency of the second signal is synchronized with the phase and the frequency of the first signal.

A method for implementing the range control function of the frequency detector is also described. In one embodiment, the method includes comparing a first frequency of a first signal with a second frequency of a second signal to determine a frequency difference. Additionally, the method includes asserting an output signal in response to the frequency difference, and in response to a determination that the second frequency is outside of a predetermined range of the first frequency.

In a further embodiment, the range control method may include counting state transition edges of the first signal in a first counter, and counting state transition edges of the second signal in a second counter. This method may additionally include inhibiting an output signal associated with the second counter in response to a determination that the first counter has reached a predetermined count, and inhibiting an output signal associated with the first counter in response to a determination that the second counter has reached the predetermined count. Additionally, the method may include resetting the first counter and the second counter in response to a determination that one of the first counter and the second counter has reached a full count.

Figure 4:
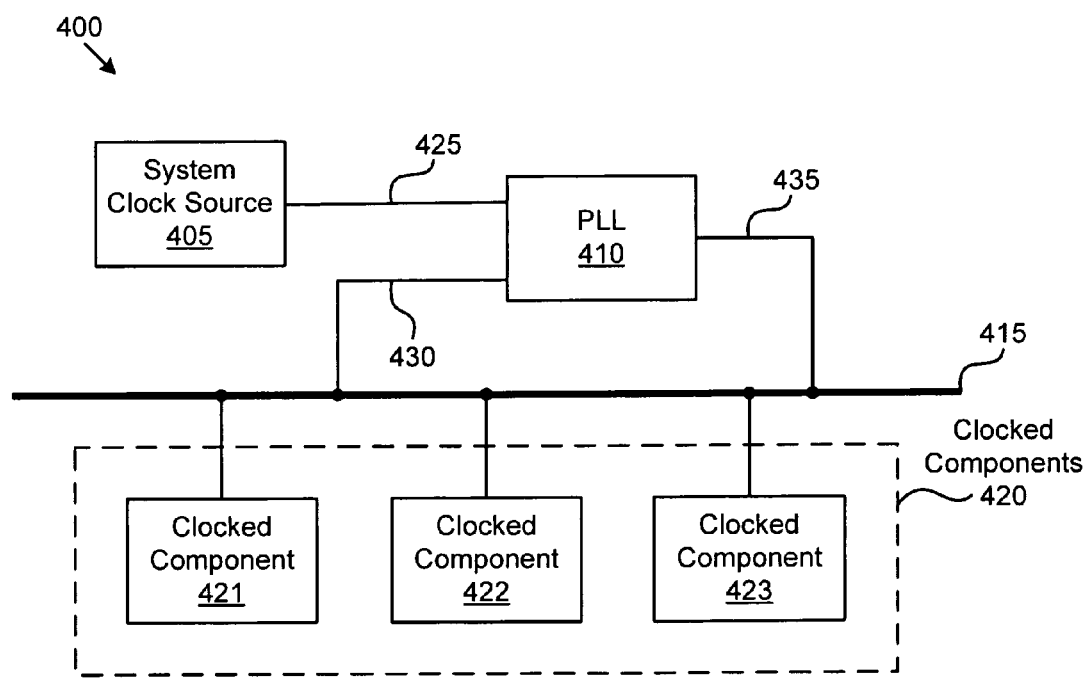
FIG. 4 illustrates a block diagram of one embodiment of a Zero-Delay Buffer clock distribution system.
Figure 5:
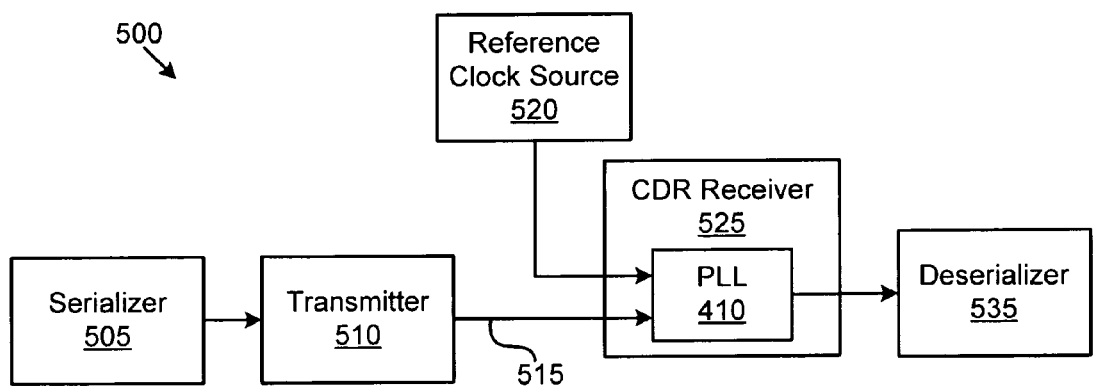
FIG. 5 illustrates a block diagram of one embodiment of a Clock Data Recovery system.

Various systems may implement fast-lock PLL circuits. A fast-lock PLL may reduce signal locking times from 3.0-3.5 µsec. to 0.5-1.0 µsec. FIGS. 4 and 5 illustrate two exemplary systems that may implement a fast-lock PLL apparatus and method.

FIG. 4 illustrates a block diagram of one embodiment of a Zero-Delay Buffer (ZDB) clock distribution system 400. In one embodiment, the ZDB clock distribution system 400 implements a fast lock PLL 410. The depicted ZDB clock distribution system 400 also includes a system clock source 405, a PLL circuit 410, a clock distribution bus 415, and one or more clocked components 420 which use a buffered clock signal from the PLL 410. The PLL 410 may receive a reference signal 640 on a reference signal line 425 from the system clock source 405 and a feedback signal 645 on a feedback signal line 430. In one embodiment, the feedback signal line 430 is coupled to an output signal line 435 via the clock distribution bus 415.

The system clock source 405 provides a reference signal 640 to the PLL 410 on the reference signal line 425. In such an embodiment, the reference signal 640 provided by the system clock source 405 has a substantially constant frequency and phase. For example, the system clock source 405 may include a quartz crystal. In an alternative embodiment, the system clock source 405 may include an output signal of a PLL circuit in another component of a computer or communication system. For example, the system clock source 405 may include an external clock reference generator.

The ZDB clock distribution system 400 also includes a PLL circuit 410. The PLL circuit 410 may regenerate and sustain a stable version of the reference signal 640 that is suitable for clocking clocked components 420. In certain embodiments, the PLL 410 may multiply the reference signal 640. Additionally, the PLL 410 may remove noise from the reference signal 640. Various embodiments of the PLL circuit 410 are described in greater detail with reference to FIGS. 6, 7, and 15-18 below. In some embodiments, the clocked components 420 may require high-speed synchronization of the output signal from the PLL 410 and the reference signal 640 from the system clock source 405. For example, a Random Access Memory (RAM) system may require high-speed generation and distribution of a clock signal when operated at high frequencies.

The ZDB clock distribution system 400 may additionally include one or more clocked components 420 requiring a clock signal to be distributed from the PLL 410. For example, certain processors, communications devices, disk drives, RAM, and other devices may include clocked components 420 requiring a common synchronized clock signal from a PLL 410. Such clocked components 420 may operate in unison based on the common clock signal. In one embodiment, the output signal line 435 from the PLL 410 may connect to the clock distribution bus 415. The clock distribution bus 415 may distribute the clock signal to one or more clocked components 420. In an alternative embodiment, signal lines coupled to one or more signal buffers or dividers in a clock distribution tree may distribute the clock signal.

FIG. 5 illustrates a block diagram of one embodiment of a clock and data recovery (CDR) system 500. The CDR system 500 may include a data serializer 505 and a transmitter 510 on a transmit side of a data communication link 515, and a CDR receiver 525 and a data deserializer 535 on a receive side of the data communication link 515. In one embodiment, the CDR receiver 525 may include a PLL 410. The reference clock source 520 may provide a reference clock signal to the PLL 410.

The serializer 505 may collect data on a parallel data bus and convert it into a serial data stream for transmission by the transmitter 510 on the data link 515. In one embodiment, the serializer 505 may include a buffer for collecting data from the parallel lines, a multiplexor, a pattern generator, a PLL circuit, and a filter. In certain embodiments, the serializer 505 may include a fast lock PLL such as the PLL 410 in the CDR receiver 525. The serializer 505 may then pass the serialized data to a transmitter 510 which may transmit the data on the data link 515. Exemplary transmitters 510 include an antenna for wireless links, a Radio Frequency (RF) driver for coaxial transmission lines, a dual tone signal generator such as a transformer used in Digital Subscriber Lines (DSL), and the like.

Likewise, the CDR receiver 525 may include a receiving antenna, cable receiver, DSL receiver, or another type of receiver. In one embodiment, the CDR receiver 525 includes a PLL 410. The PLL 410 may recover a clock signal embedded in the signal transmitted by the transmitter 510 over the data link 515, and may use the reference clock source 520 to establish the approximate clock frequency in order to synchronize to the clock signal embedded in the transmitted signal. In certain embodiments, the PLL 410 may include a fast lock PLL circuit such as the circuits described in greater detail with reference to FIGS. 6, 7, and 15-18 below.

In a further embodiment, the clock and data signals recovered by the CDR receiver 525 may be placed on a receiving parallel data bus by the deserializer 535. The deserializer 535 may include similar components to those described in relation to the serializer 505. For example, the deserializer 535 may include another fast lock PLL 410.

Figure 6:
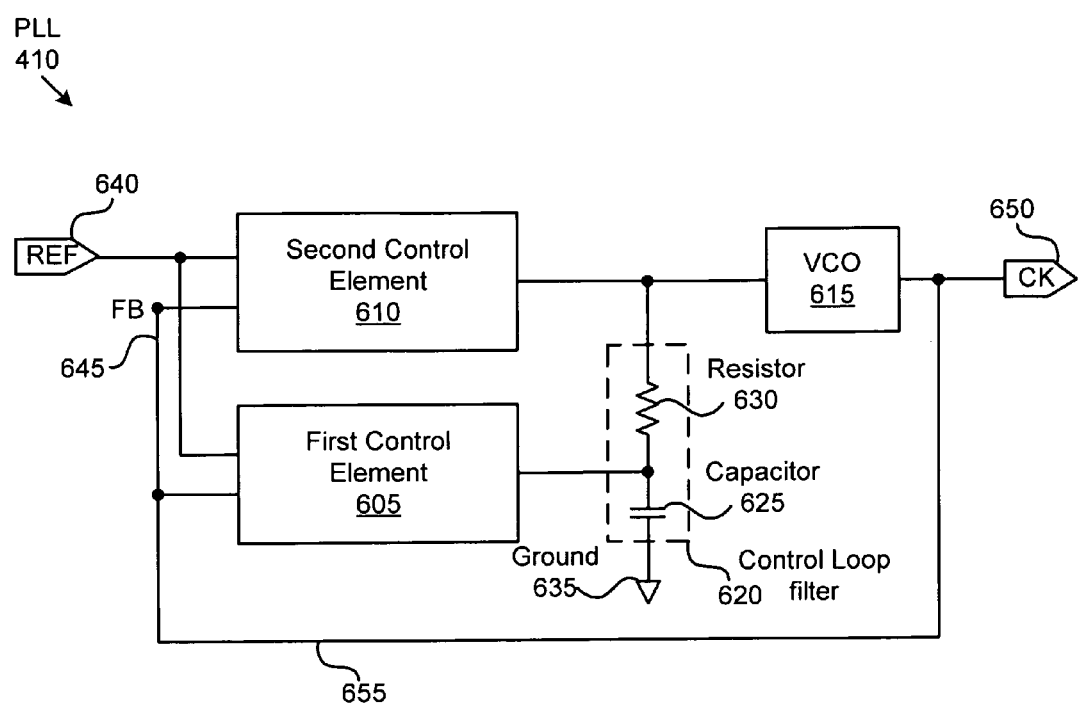
FIG. 6 illustrates a block diagram of one embodiment of a fast lock PLL circuit.

FIG. 6 illustrates a block diagram of one embodiment of a fast lock PLL circuit 410. In one embodiment, the PLL 410 includes a first control element 605 and a second control element 610 for controlling the voltage at a control node of a VCO 615. The illustrated PLL 410 also includes a control loop filter 620. The PLL 410 also includes a reference signal line 640 to receive a reference signal 640 and a feedback signal line 645 to receive a feedback signal 645. Additionally, the PLL 410 includes an output clock line 650 for transmitting an output clock signal 650. For convenience, reference to the reference signal line 640, the feedback signal line 645, and the output clock line 650 may refer to the physical communication medium (e.g., wires) or to a signal on the corresponding line, unless indicated otherwise. In some embodiments, the feedback signal line 645 may be coupled to the output line 650 by a feedback loop 655.

In some embodiments, the fast lock PLL circuit 410 may be described as having two control loops. The first control loop includes the first control element 605, the control loop filter 620, the VCO 615, and the feedback signal line 645. The second control loop includes the second control element 610, the control loop filter 620, the VCO 615, and the feedback signal line 645. Although the first control loop may dominate the second control loop during operation, the first and second control loops operate in parallel to facilitate the fast lock operations described herein.

The first control element 605 may receive a reference signal 640 from the reference line 640 and a feedback signal 645 from the feedback line 645. In one embodiment, the first control element 605 may detect a frequency of the feedback signal 645 and a frequency of the reference signal 640. In response to detecting a frequency difference, as described further with reference to the timing diagrams in FIGS. 13A and 13B, the first control element 605 may adjust the frequency of the feedback signal 645 until the frequency of the feedback signal 645 is within a predetermined range of the frequency of the reference signal 640. In one embodiment, addition of the first control element 605 may reduce signal locking times from about 3.0-3.5 µsec to about 0.5-1.0 µsec.

The second control element 610 may also receive the reference signal 640 from the reference line 640 and the feedback signal 645 from the feedback line 645. In one embodiment, the second control element 610 may tune the phase and the frequency of the feedback signal 645 until the phase and the frequency of the feedback signal 645 are synchronized or phase-locked with the reference signal 640.

In one embodiment, the control loop filter 620 includes at least one resistor 630 and at least one capacitor 625. Additionally, the control loop filter 620 may include a connection to ground 635. In some embodiments, the control loop filter 620 may be connected to a control node of the VCO 615 and provide a control voltage for regulating the frequency of the output signal. In a further embodiment, the capacitor 625 may provide the primary voltage reference for controlling the frequency of the output signal.

Even though only one capacitor 625 is shown in the control loop filter 620, other embodiments may include configurations where a second capacitor is present at the control node of the VCO 615. Additionally, other configurations having more capacitors and/or resistors may be implemented. In some embodiments, one capacitor may be referred to as the main loop filter capacitor. Alternatively, the configuration may include a large capacitor with which the terminal voltage has a direct correlation to the frequency of the VCO 615. Also, references to an output from the VCO 615 may refer to outputs which may or may not have a divider in the signal path.

The first control element 605 may connect directly to the capacitor 625. Consequently, when the first control element 605 applies a charge to the capacitor 625, the voltage across the resistor 630 may remain substantially unchanged. Therefore, the first control element 605 may make rapid adjustments to the reference voltage at the control node, relative to the rate of tuning in the second control element 610, without overshooting the frequency of the reference signal 640 and without creating an unstable output signal.

Conversely, the second control element 610 may couple to the control node of the VCO 615 as well as to the resistor 630 of the control loop filter 620. In such an embodiment, the voltage on the resistor 630 and the capacitor 625 may change as the second control element 610 applies a charge to the control loop filter 620. However, the voltage change on the resistor 630 may be temporary, lasting only as long as the flow of charge is supplied by the second control element 610. Thus, the second control element 610 may gradually tune the phase and frequency of the output signal and associated feedback signal 645 until the feedback signal 645 is phase locked with the reference signal 640.

Figure 7:
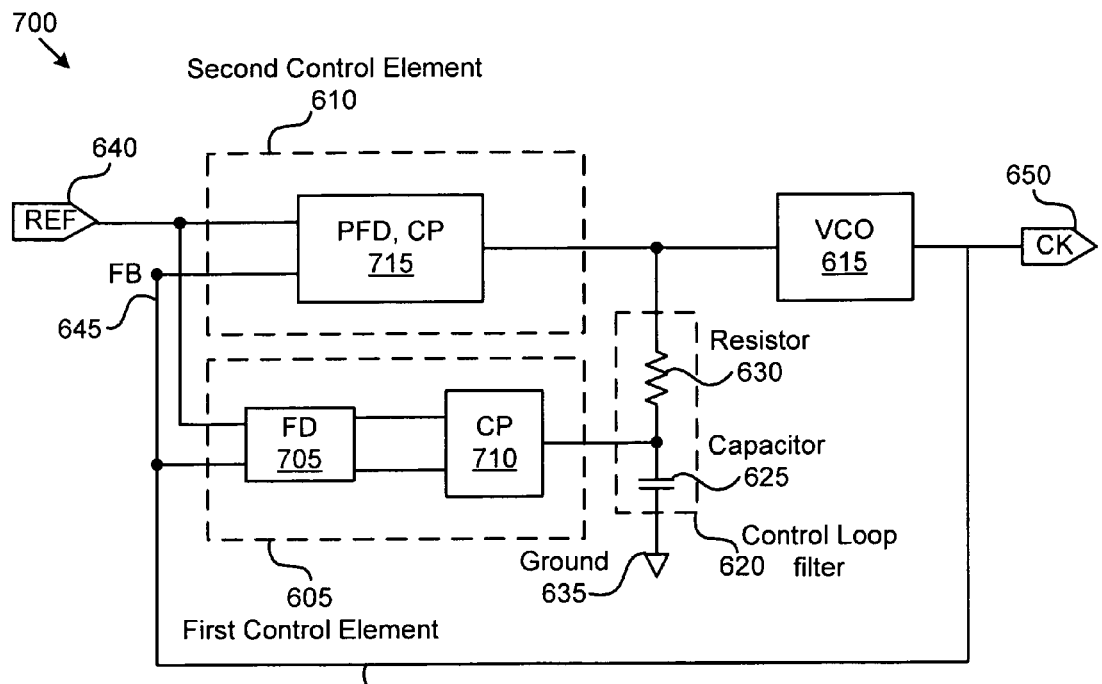
FIG. 7 illustrates a detailed block diagram of one embodiment of a fast lock PLL circuit.

FIG. 7 illustrates a detailed block diagram of one embodiment of a fast lock PLL circuit 700. Similar to the PLL 600 described above, the PLL 700 includes a first control element 605, a second control element 610, and a first VCO 615. Additionally, the PLL 700 includes a reference signal line 640, a feedback signal line 645, and an output signal line 650 coupled to the feedback signal line 645 by a feedback loop 655. The PLL 700 also includes a control loop filter 620.

In one embodiment, the first control element 605 includes a frequency detector (FD) 705 and a charge pump (CP) 710. The frequency detector 705 may receive a reference signal 640 from the reference line 640 and a feedback signal 645 from the feedback line 645. In one embodiment, the frequency detector 705 compares the frequency of the feedback signal 645 with the frequency of the reference signal 640 to determine a frequency difference. If the frequency difference is not within a dead zone, described in further detail with reference to FIG. 8, the frequency detector 705 may signal the charge pump 710 to either increase the voltage level of the capacitor 625 if the frequency of the feedback signal 645 is lower than the frequency of the reference signal 640, or decrease the voltage level of the capacitor 625 if the frequency of the feedback signal 645 is higher than the frequency of the reference signal 640, depending on the voltage-frequency characteristic of the VCO 615. In one embodiment, the frequency detector 705 includes a range controller as described in relation to FIGS. 10-12.

The charge pump 710 may regulate the voltage level on the capacitor 625 in response to a signal from the frequency detector 705. Additionally, the charge pump 710 may generate a flow of charge for increasing or decreasing the voltage level on the capacitor 625. In one embodiment, the charge pump 710 includes a "Bang-Bang" (i.e., fully on, fully off) charge pump. Other charge pump 710 products and configurations are also recognizable by one of ordinary skill in the art.

In the illustrated embodiment, the second control element 610 includes a combination device 715 having a phase-frequency detector (PFD) and charge pump (CP). For example, the second control element 610 may include a combination device 715 commonly used in typical PLL circuits. One of ordinary skill in the art will readily recognize various embodiments of a combination device 715. Thus, in certain embodiments, typical PLL components may be included in the second control element 610, but the performance of the PLL 700 may be enhanced by implementation of the first control element 605. Some benefits of such an embodiment include low cost of implementation, readily available components, high speed signal locking, and a high level of stability in the PLL output.

Figure 8:
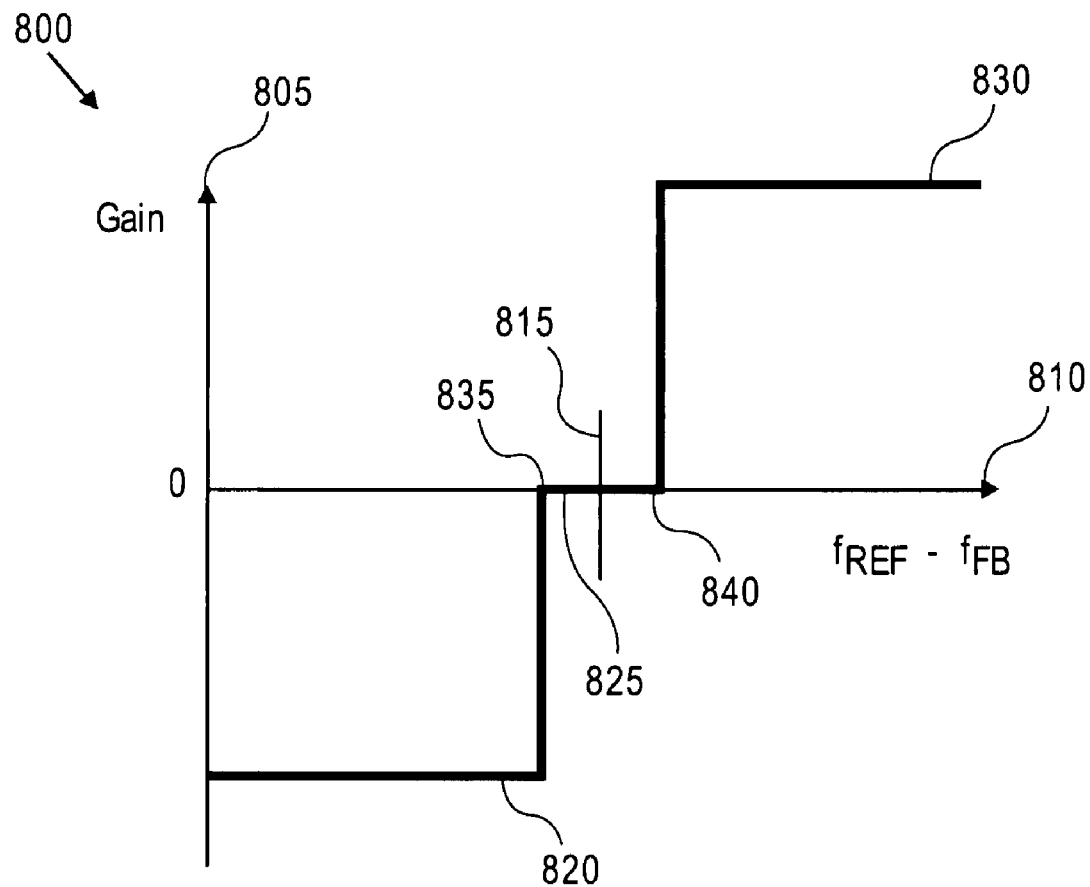
FIG. 8 illustrates one embodiment of a frequency detector output as a function of a frequency of a feedback signal.

FIG. 8 illustrates one embodiment of a graphical representation of the output 800 of a frequency detector 705 as a function of frequency difference between the reference signal 640 and the feedback signal 645. The y-axis 805 represents the output of the frequency detector 705 and the x-axis 810 represents the frequency difference between the reference signal 640 and the feedback signal 645. The line 815 on the x-axis 810 represents where the frequency feedback signal 645 is equal to that of the reference signal 640.

The characteristic curve of the output of the frequency detector 705 includes three main regions: a negative region 820, a zero region 825, and a positive region 830. The zero region 825 is also referred to as the "dead zone." In one embodiment, the dead zone 825 is defined by a lower frequency 835 and an upper threshold frequency 840. In certain embodiments, the dead zone 825 is centered on line 815. The negative region 820 includes differences in the frequencies below the lower threshold frequency 835, and the positive region 830 includes differences in the frequencies above the upper threshold frequency 840.

In some embodiments, the charge pump 710 assigns a sign to the output signal of the charge pump 710 according to the region in which the frequency difference between the reference signal 640 and the feedback signal 645 is located. For example, the frequency detector 705 may generate an "up" signal to the charge pump 710 when the frequency difference is in the negative region 820 between 0 Hz and the lower threshold frequency 835. Alternatively, the frequency detector 705 may generate a "down" signal to the charge pump 710 when the frequency difference is in the positive region 830 above the upper threshold frequency 840. In one embodiment, when the frequency difference is in the predetermined dead zone 825, the frequency detector 705 does not communicate a signal the charge pump 710. One example of a frequency detector 705 that may exhibit the characteristics described above is a symmetrical range controller 1000, as described in relation to FIG. 10 below.

Figure 9:
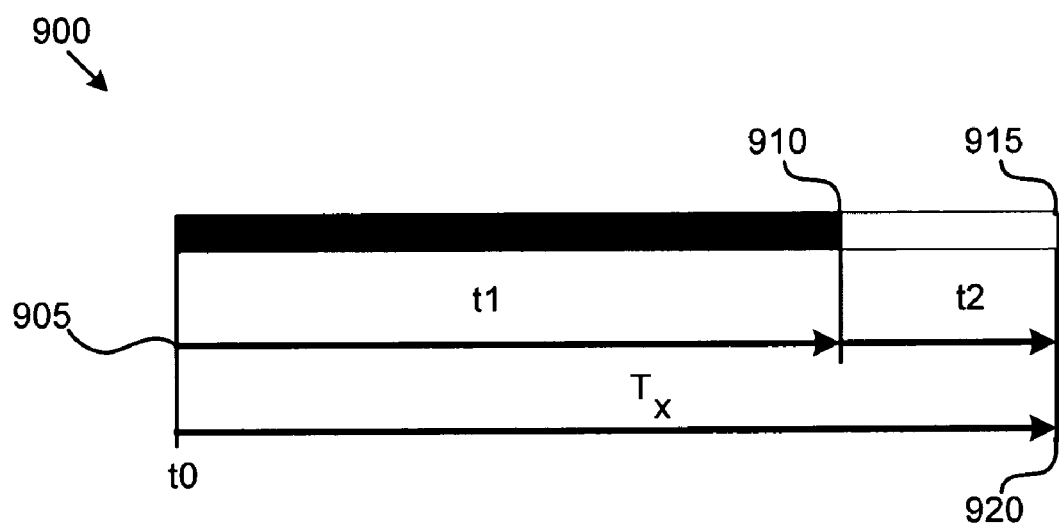
FIG. 9 illustrates a timing diagram of one embodiment of a symmetrical range controller.

FIG. 9 illustrates a timing diagram 900 of one embodiment of one half of a range controller type frequency detector 705. (Refer to the description of FIGS. 10-12 for a more detailed discussion of "one half" of a range controller type frequency detector.) In one embodiment, the frequency detector 705 includes a counter 1125 configured to count the transition edges of an associated signal. Depending on the frequency of the signal, the counter 1125 may take a time Tx to advance from a zero count 905 to a full count 920. In one embodiment, either the up output or the down output of the frequency detector 705 is inhibited at a threshold count 910 defined by the time t1. The time to reach a full count 915 from the threshold count 910 is defined by t2. Details with respect to setting the threshold count 910 are described with reference to FIG. 12.

In one embodiment, the total time Tx to reach a full count 915 is defined by the frequency of the measured signal and the number of bits the counter 1125 uses to count. In general, the total number of transition edges that a counter 1125 may count is defined by $2^n$, where n represents the number of bits the counter 1125 uses to count the transition edges. Thus, a three bit counter may count up to $2^3$ transitions or eight total transitions. As an example, the total time Tx to count eight transitions is a function of the frequency of the signal.

The counter 1125 may be selected to provide an optimum balance of resolution and responsiveness for the frequency of the signal. For example, the time Tx to complete a full count of eight for a high frequency signal may be short, nevertheless, the threshold count 910 may be determined for one of only 8 bit states. Therefore, the resolution is compromised for responsiveness. In general, a three bit counter may balance these tradeoffs adequately for typical computing frequencies.

Figure 10:
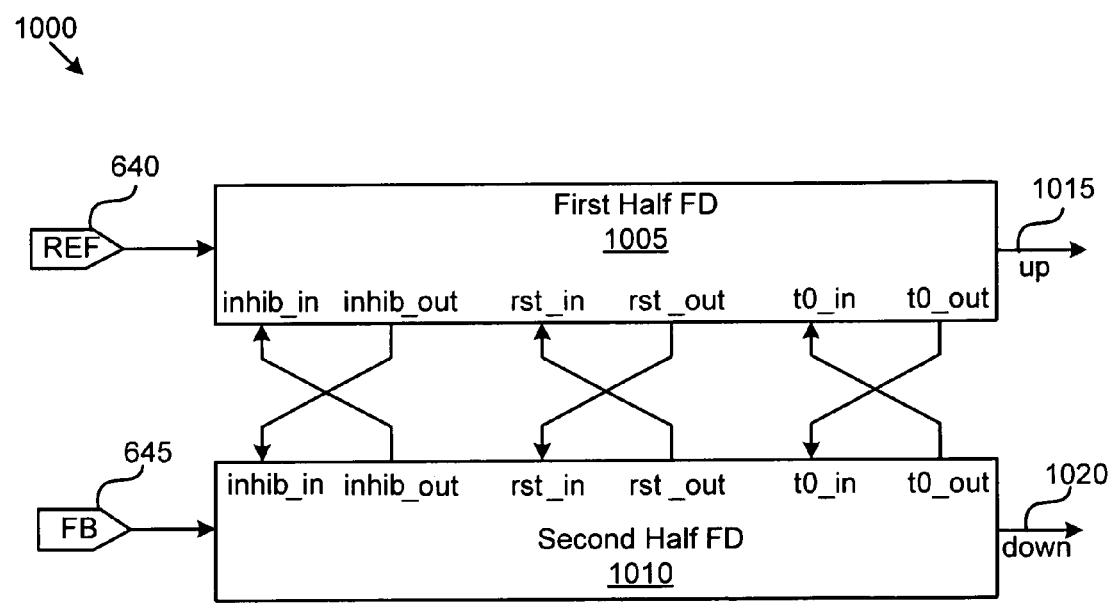
FIG. 10 illustrates a block diagram of one embodiment of a symmetrical range controller.

FIG. 10 illustrates a block diagram of one embodiment of a symmetrical range controller 1000. In some embodiments, the frequency detector 705 includes the symmetrical range controller 1000. The illustrated symmetrical range controller 1000 includes a first half 1005 and a second half 1010. The symmetrical range controller 1000 is symmetric because the first half 1005 and the second half 1010 may be substantially identical. Each half receives an input signal and generates an output to the charge pump 710. Additionally, both halves transmit and receive a set of handshake signals.

The first half 1005 may receive the reference signal 640 from the reference signal line 640. The second half 1010 may receive the feedback signal 645 from the feedback signal line 645. Additionally, the first half 1005 may generate an up output signal 1015 and the second half 1010 may generate a down output signal 1020. In one embodiment, the frequency detector 705 may generate either the up output signal 1015 or the down output signal 1020 at a time, but not both concurrently.

As described above in relation to FIG. 9, the first half frequency detector 1005 may inhibit the second half frequency detector 1010 when a counter portion of the first half frequency detector 1005 reaches the threshold count 910. Alternatively, the second half frequency detector 1010 may inhibit the first half frequency detector 1005 in a like manner. The inhibit signal 1235 is passed between the first half frequency detector 1005 and the second half frequency detector 1010 by the cross-connected inhib_in and inhib_out lines.

Additionally, the first half frequency detector 1005 or the second half frequency detector 1010 may signal its counterpart to reset in response to reaching a full count 915. In one embodiment, the reset signal is communicated via the cross-connected rst_in and rst_out lines. In a further embodiment, either half frequency detector 1005 or 1010 may signal its counterpart to clear previously set inhibit signals 1235 and output signals through the cross-connected t0_in and t0_out lines.

Figure 11:
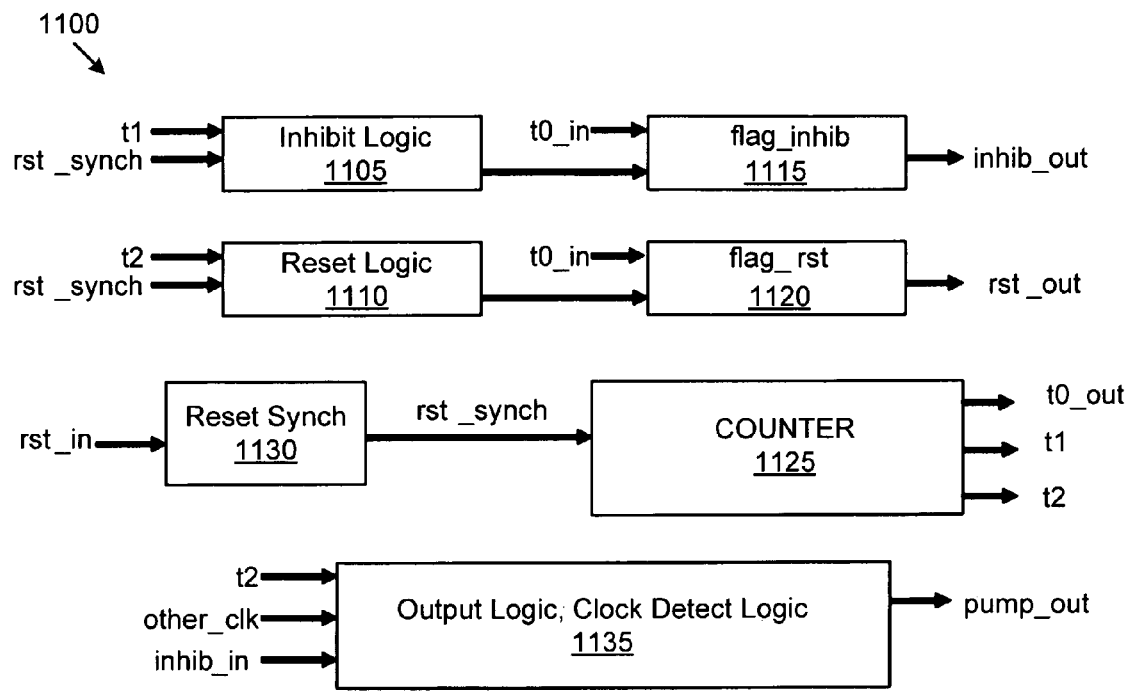
FIG. 11 illustrates a detailed block diagram of one embodiment of one half of a symmetrical range controller.

FIG. 11 illustrates a detailed block diagram of one embodiment of a half 1100 of a symmetrical range controller 1000. In one embodiment, the half frequency detector 1100 includes inhibit logic 1105, reset logic 1110, an inhibit flag device 1115, a reset flag device 1120, a counter 1125, a reset synchronization device 1130, and output/clock detect logic 1135.

In one embodiment, the counter 1125 has a fixed word length of a predefined number of bits as described above with relation to FIG. 9. The counter 1125 may also include one or more bit state output lines. For example, a three bit counter 1125 may include three bit state lines indicating the state of each of the three counter bits (however, the full state of the counter 1125 may not be available external to itself, since this may include signals other than the bit state lines). The bit state lines may be used by other logic units to determine t1, t2, and t0. In another embodiment, the bit state lines may be used to generate signals or "flags" indicating that t0, t1, or t2 has been reached by the counter 1125. Additionally, the counter 1125 may implement one or more internal "wait states" to synchronize its own roll-over with the reset of its counterpart in a counterpart half frequency detector 1100. The counter 1125 may additionally receive a synchronized (to its own clock)

version of the reset signal from a counterpart half frequency detector 1100. The reset synchronization device 1130 may include a buffer, one or more register elements and an input port configured to receive the reset signal from the rst_in port.

In one embodiment, the inhibit logic 1105 receives the reset_synch output from the reset synchronization device 1130 and t1 from the counter 1125. In response to an indicator that the counter 1125 has reached t1 on the t1 line, the inhibit logic 1105 may set an inhibit flag 1115 to generate the inhib_out signal for inhibiting the counterpart half frequency detector 1100. In one embodiment, the inhibit flag 1115 includes a flip-flop device configured to generate and maintain a voltage signal on the inhib_out line to indicate that t1 has been reached. The inhibit flag 1115 may be reset by the t0_in signal from the counterpart half frequency detector 1100.

Additionally, the reset logic 1110 receives the reset_synch output from the reset synch device 1130 and t2 from the counter 1125. In response to an indicator that the counter 1125 has reached t2 on the t2 line, the reset logic 1110 may set a reset flag 1120 to generate the rst_out signal for resetting the counterpart half frequency detector 1100.

In one embodiment, the reset flag 1120 includes a flip-flop device configured to generate and maintain a voltage signal on the rst_out line to indicate that t2 has been reached. The reset flag 1120 may be reset by the t0_in signal from the counterpart half frequency detector 1100.

In a further embodiment, the half frequency detector 1100 may include an output and clock detect logic unit 1135. Although the output logic and the clock detect logic are shown combined into a single output/clock detect logic unit 1135, other embodiments may implement the logic in separate units. The output/clock detect logic unit 1135 may receive the t2 signal from the counter 1125 and an inhibit signal 1235 (inhib_in) from the counterpart half frequency detector 1100. The t2 signal may generate an output signal (pump_out). However, if the inhib_in signal has been received from the counterpart half frequency detector 1100, then the pump_out signal will not be generated. In one embodiment, the clock signal from the counterpart half frequency detector 1100 is sensed and, if not detected within a full count cycle, the pump_out signal will not be generated, because the lack thereof indicates that the counterpart half frequency detector 1100 is not receiving its associated clock signal and, hence, the frequency detector cannot make a valid decision about a frequency difference.

Figure 12:
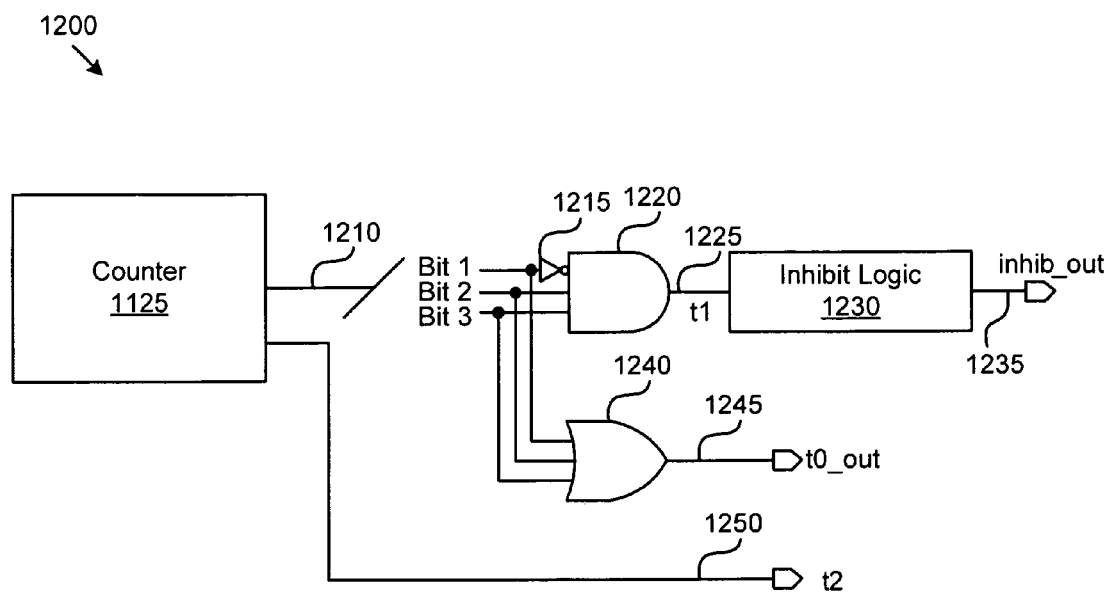
FIG. 12 illustrates a circuit diagram of one embodiment of logic units in one half of a symmetrical range controller.

FIG. 12 illustrates a circuit diagram of one embodiment of logic 1200 in a half of a symmetrical range controller 1000. The logic 1200 is an exemplary logic configuration for determining whether the counter 1125 has reached the threshold count t1 or has been reset t0. Additionally, in one embodiment, the full count t2 is indicated by a signal generated by the counter 1125 on the t2 line 1250.

In one embodiment, the logic for setting and determining t1 includes an AND gate 1220 configured to receive the bit state signals from the counter 1125. In one embodiment, the bit state signals are transmitted on separate bit state lines of a bit state bus 1210. Additionally, one or more signal inverters 1215 may be positioned on the input of the AND gate 1220. The position of the inverter 1215 may determine the number of counts designated for a. Alternatively, other configurations of logic may be used to determine the number of transitions to count for t1. When the designated threshold count t1 is reached, the AND gage 1225 may signal the inhibit logic 1230 on the t1 input line 1225. The inhibit logic 1230 may then assert the inhib_out signal on the inhib_out signal line 1235.

In the depicted example, the counter 1125 has a fixed word-length of three bits. The three bit counter 1125 may count a total of eight signal transition edges. In the absence of the inverter 1215, the AND gate 1220 would only assert when all three bits were in a '1' state (i.e., 111), or when the counter 1125 had reached a full count. Nevertheless, the inverter 1215 causes the AND gate 1220 to assert when the bit corresponding to the bit state line coupled to the inverter is in a '0' state (i.e., 000). In the depicted embodiment, the AND gate 1220 may assert when the bit states are '110', or when the counter 1125 reaches a count of six. Therefore, the exemplary placement of the inverter 1215 sets t1 equal to six counts. In other words, the number of counts for t1 may be adjusted by the placement of the inverter 1215. Although a single inverter 1215 is shown, other embodiments may include more than one inverter 1215, for example, to decode other bit states.

In one embodiment, signals generated by the inhibit flag device 1115 and the reset flag device 1120 are cleared in response to receiving a t0_in signal. As shown in FIG. 10, the t0_in signal is received from the t0_out port of the counterpart half frequency detector. The t0_out signal may be generated by an OR gate 1240 configured to receive the bit state signals. In one embodiment, the inhibit flag device 1115 and the reset flag device 1120 are enabled on a high signal on the t0_in line. The flag devices 1115 and 1120 may be cleared when the t0_in signal is pulled low. The OR gate 1240 may generate a logic high on t0_out when any of the bit states signals are at a '1' state, or when the counter 1125 is not in a zero count state. Nevertheless, when there is a zero count on the counter 1125, each of the bit state lines indicates a '0' bit, and the OR gate 1240 pulls the t0_out line 1245 low.

Figure 13A:
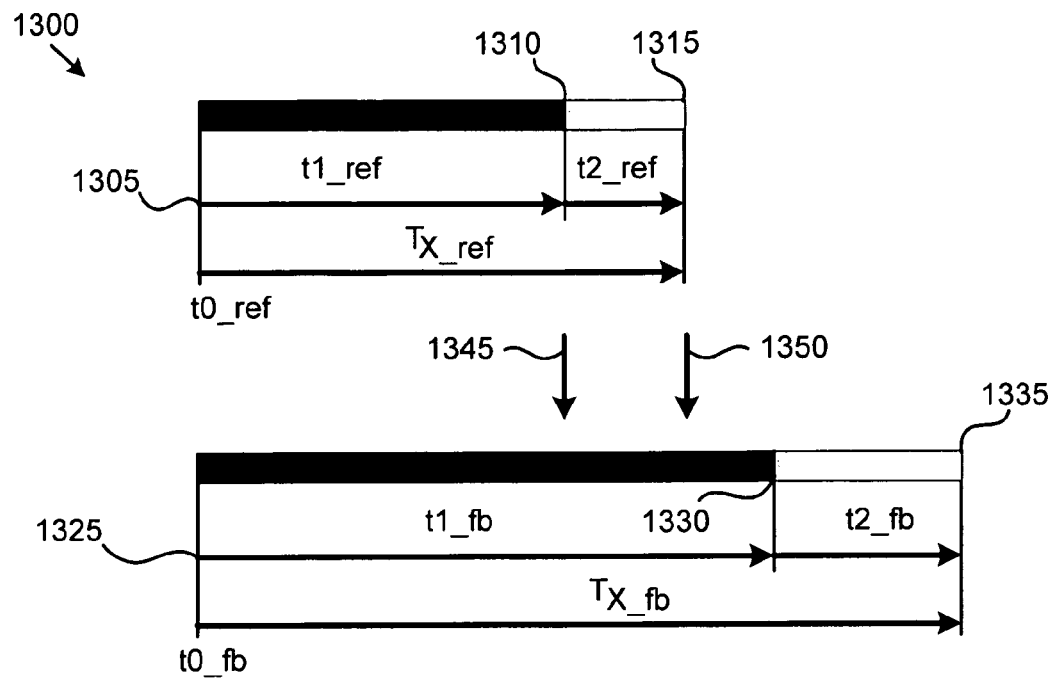
FIG. 13A illustrates a timing diagram of one embodiment of a symmetrical range controller response, in which a frequency of a feedback signal is outside of a predetermined range of a reference frequency.

FIG. 13A illustrates a timing diagram of one embodiment of the response 1300 of a symmetrical range controller 1000, where a frequency of a feedback signal 645 is outside of the dead zone 825 of the reference signal 640. In the depicted embodiment, the top timing diagram represents the timing of the first half frequency detector 1005, which receives the reference signal 640. The bottom timing diagram represents the timing of the second half frequency detector 1010, which receives the feedback signal 645.

At t0_ref 1305 and t0_fb 1325, the first half frequency detector 1005 and the second half frequency detector 1010 may be reset, each having a zero count at t0. If the frequency of the feedback signal 645 is lower than the frequency of the reference signal 640, the counter 1125 of the first half frequency detector 1005 may reach t1 before the counter 1125 of the second half frequency detector 1010. At t1, the first half frequency detector 1005 asserts 1345 an inhibit signal 1235 to inhibit the output 1020 of the second half frequency detector 1010.

If the frequency of the feedback signal 645 is outside of the dead zone 825 of the frequency of the reference signal 640, the counter 1125 of the first half frequency detector 1005 may reach t2 1315 before receiving an inhibit signal 1235 from the second half frequency detector 1010, which may have been asserted at t1 1330 of the second half frequency detector 1010. In such an embodiment, the first half frequency detector 1005 may assert the output signal 1015. Additionally, the first half frequency detector 1005 may signal 1350 the second half frequency detector 1010 to reset. In such an embodiment, the counter 1125 in the second half frequency detector 1010 may not reach the count t1 and therefore also not the full count at t2 1335.

Figure 13B:
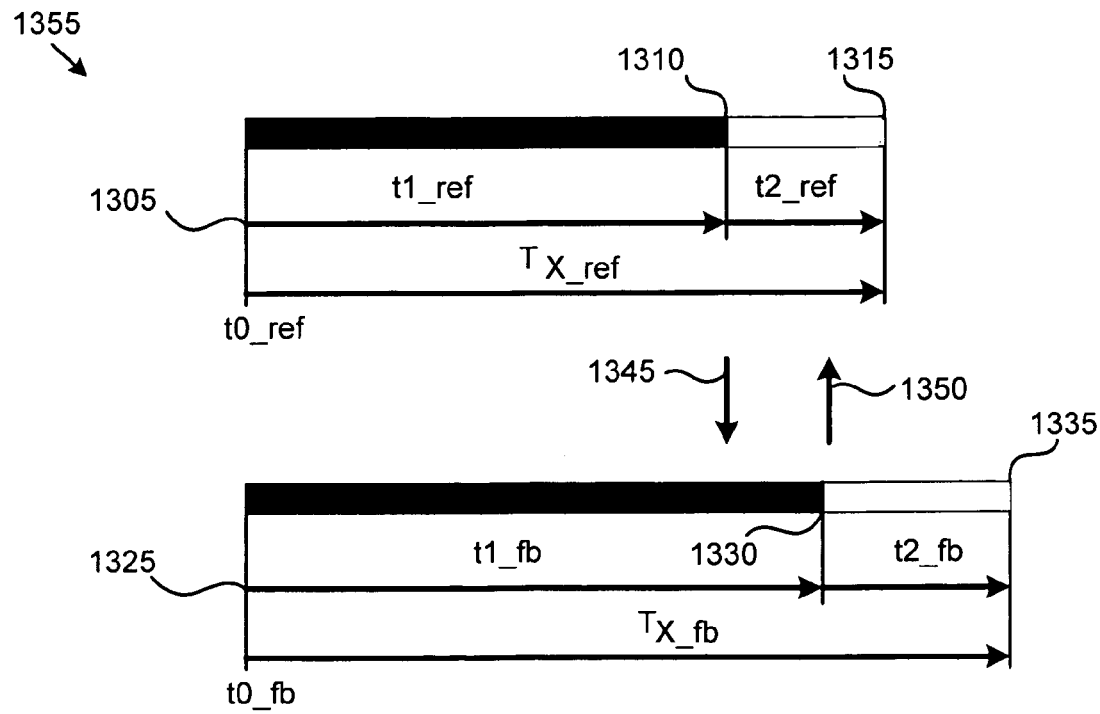
FIG. 13B illustrates a timing diagram of one embodiment of a symmetrical range controller response, in which a frequency of a feedback signal is within a predetermined range of a reference frequency.

FIG. 13B illustrates a timing diagram of one embodiment of the response 1355 of a symmetrical range controller 1000, where a frequency of a feedback signal 645 is within the dead zone 825 of the reference frequency 640. In one embodiment, both halves 1005 and 1010 of the frequency detector 705 start at a zero-count 1305 and 1325. In this depicted embodiment, the frequency of the feedback signal 645 may be lower than the frequency of the reference signal 640, but the frequency of the feedback signal 645 may lie within the dead zone 825.

At t1 1310, the first half frequency detector 1005 may inhibit 1345 the second half frequency detector 1010. Nevertheless, when the frequency is within the dead zone 825, the second half frequency detector 1010 may reach t1 1330 and inhibit 1350 the first half frequency detector 1005 before either half 1005 and 1010 reaches t2 1315 and 1335. In such an embodiment, neither half frequency detector 1005 and 1010 generates an output signal 1015 and 1020, yet either half may reach t2 and reset the counterpart half.

Figure 14:
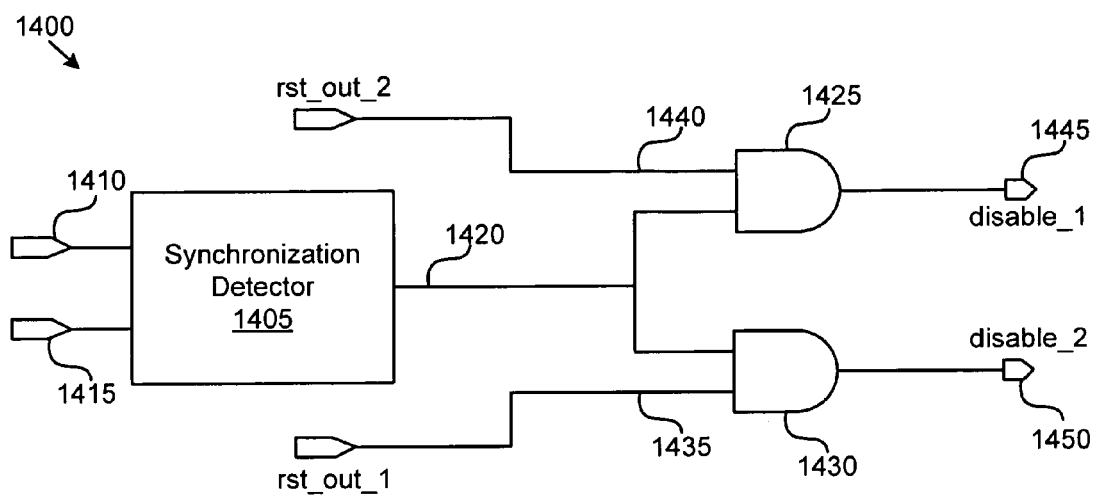
FIG. 14 illustrates a circuit diagram of one embodiment of disable logic.

One embodiment of the frequency detector 1000 may include logic to disable the outputs of frequency detector 1000. FIG. 14 illustrates a circuit diagram of one embodiment of disable logic 1400. In the depicted embodiment, a synchronization detector 1405 receives the first signal on a first signal line 1410 and the second signal on a second signal line 1415. The synchronization detector 1405 may generate a common disable signal 1420 in response to a determination that the first signal and the second signal are synchronized. A first AND gate 1425 and a second AND gate 1430 are configured to receive the common disable signal 1420 and a rst_out signal from each of the counterpart frequency detector halves 1100 (e.g., rst_out_1 from the first half frequency detector 1005 and rst_out_2 from the second half frequency detector 1010). In one embodiment, the AND gates 1425 and 1430 may generate disable signals 1445 and 1450 for the first half frequency detector 1005 and the second half frequency detector 1010 substantially simultaneously. As a result, the first half frequency detector 1005 and the second half frequency detector 1010 may be disabled substantially simultaneously. In the depicted embodiment, the AND gate 1425 receives the common disable signal 1420 and the rst_out_2 signal 1440 from the second half frequency detector 1010 as inputs and generates the disable_1 signal 1445 to disable the first half frequency detector 1005. Similarly, the AND gate 1430 receives the common disable signal 1420 and the rst_out_1 signal 1435 from the first half frequency detector 1005 as inputs and generates the disable_2 signal 1450 to disable the second half frequency detector 1010. Alternative embodiments incorporating other logic configurations may be implemented to achieve the end of disabling the frequency detector 705 in response to a determination that the first signal and the second signal are synchronized.

Figure 15:
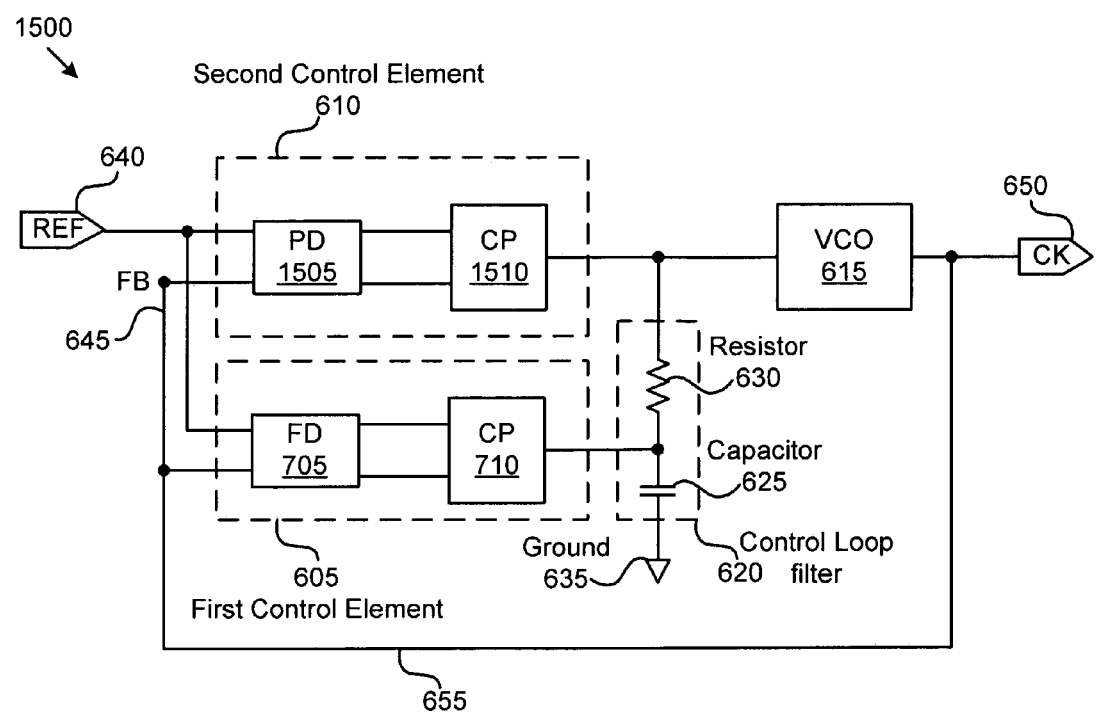
FIG. 15 illustrates a block diagram of an alternative embodiment of the fast lock PLL circuit.

FIG. 15 illustrates a block diagram of an alternative embodiment of the fast lock PLL circuit 1500. In this embodiment, the first control element 605 includes a frequency detector 705 and a charge pump 710. However, in this embodiment, the second control element 610 includes a phase detector (PD) 1505 and a second charge pump 1510, instead of the combination device 715. In such an embodiment, the first control element 605 may make frequency adjustments to the feedback signal 645 until the feedback signal 645 and the reference signal 640 are frequency-locked. The second control element 610 may tune the phase of the feedback signal 645 until the feedback signal 645 is phase-locked with the reference signal 640. In one embodiment, the frequency detector 705 may include the symmetrical range controller 1000.

Another embodiment of the fast lock PLL circuit 1500 may be implemented in a CDR application. As an example, the phase detector 1505 receives the feedback signal 645 and a signal from the transmission medium as inputs. The reference signal 640 is not input to the phase detector 1505. The frequency detector 705 receives the reference signal 640. The frequency detector 705 also receives the feedback signal 645 via a divider.

Figure 16:
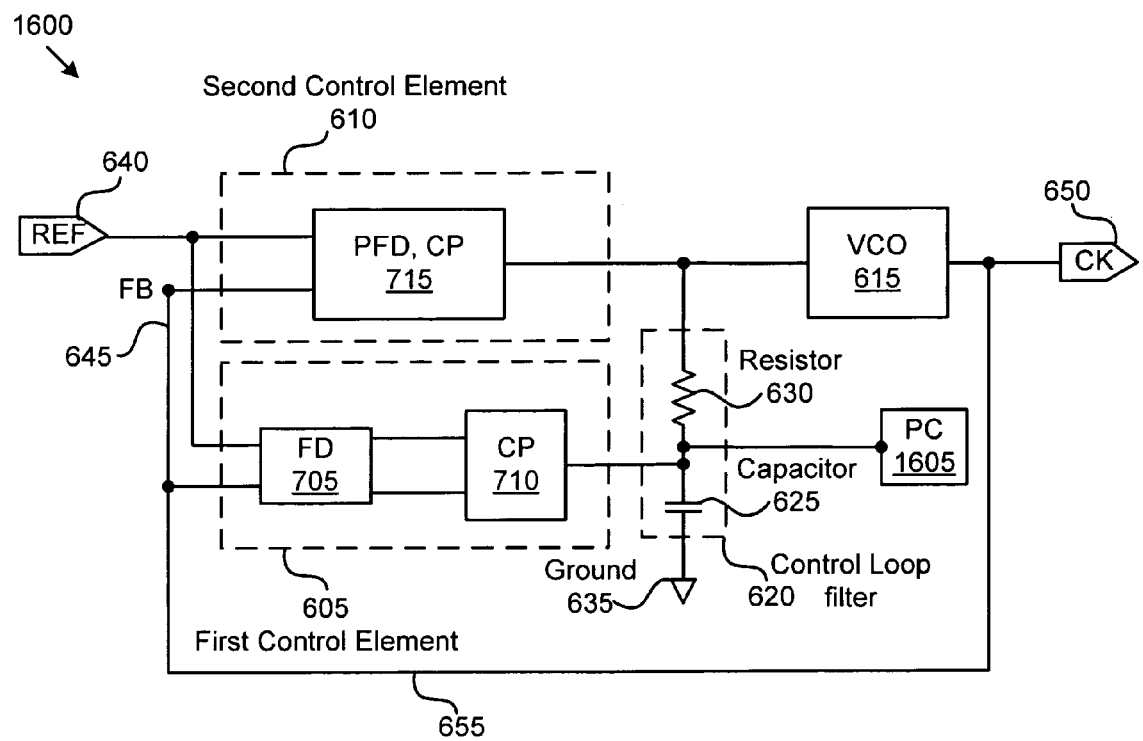
FIG. 16 illustrates a block diagram of an alternative embodiment of a fast lock PLL circuit incorporating a pre-charge source.

FIG. 16 illustrates a block diagram of another alternative embodiment of a fast lock PLL circuit 1600 incorporating a pre-charge source 1605. In one embodiment, the pre-charge source 1605 charges the main capacitor 625 to a predetermined voltage level upon initialization of the fast lock PLL circuit 1600. The pre-charge source 1605 may be coupled between the resistor 630 and the main capacitor 625. A pre-charge source 1605 may include a pre-charged capacitor, a regulated power supply line, or the like.

Figure 17:
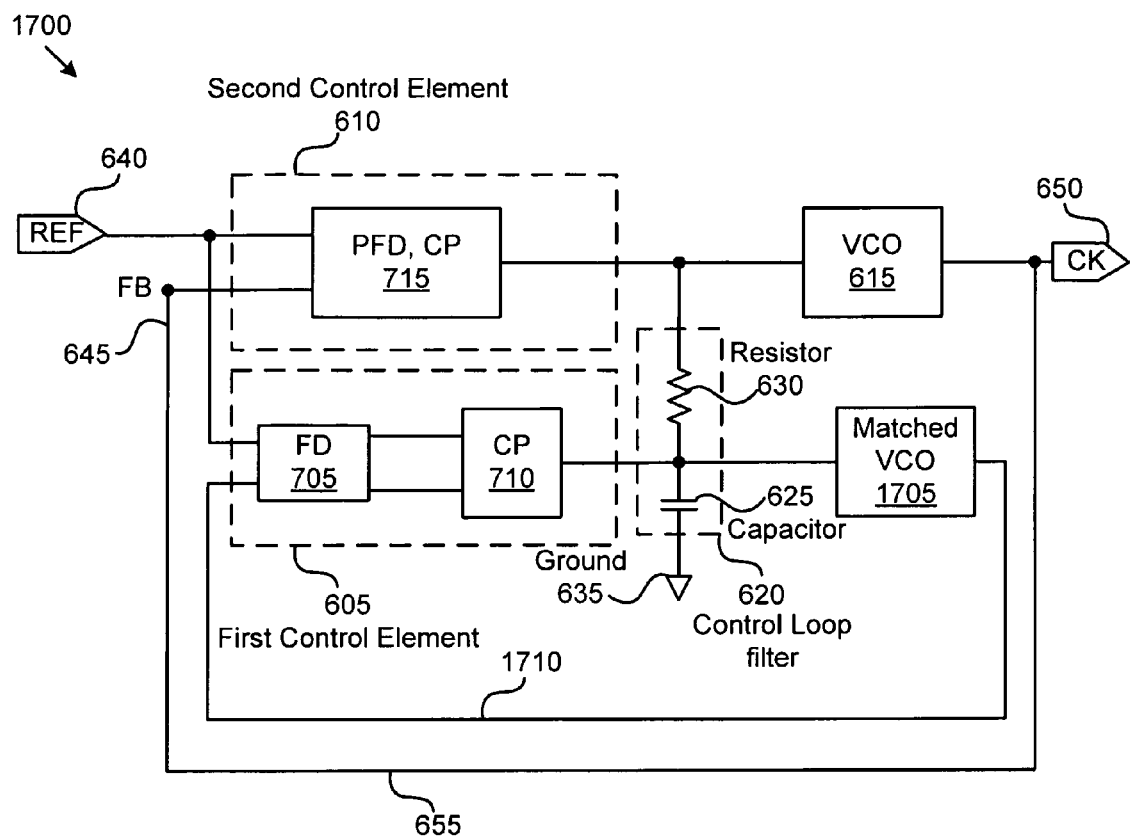
FIG. 17 illustrates a block diagram of an alternative embodiment of a fast lock PLL circuit incorporating matched VCOs.

FIG. 17 illustrates a block diagram of an alternative embodiment of a fast lock PLL circuit 1700 incorporating a matched VCO 1705. In one embodiment, the first VCO 615 is configured to minimize the noise of the output signal on the clock line 650. Nevertheless, in such an embodiment, the first VCO 615 may be relatively unresponsive to adjustments to the control voltage at its input. In such an embodiment, a second replica VCO 1705, which is matched to the first VCO 615, but lacking some of the filtering and possibly scaled down in size, or else configured to be less power-consumptive, may be connected to the first control element 605. An additional feedback line 1710 connected to the output of the second VCO 1705 may provide more responsive feedback than the feedback line 655 from the first VCO 615.

Figure 18:
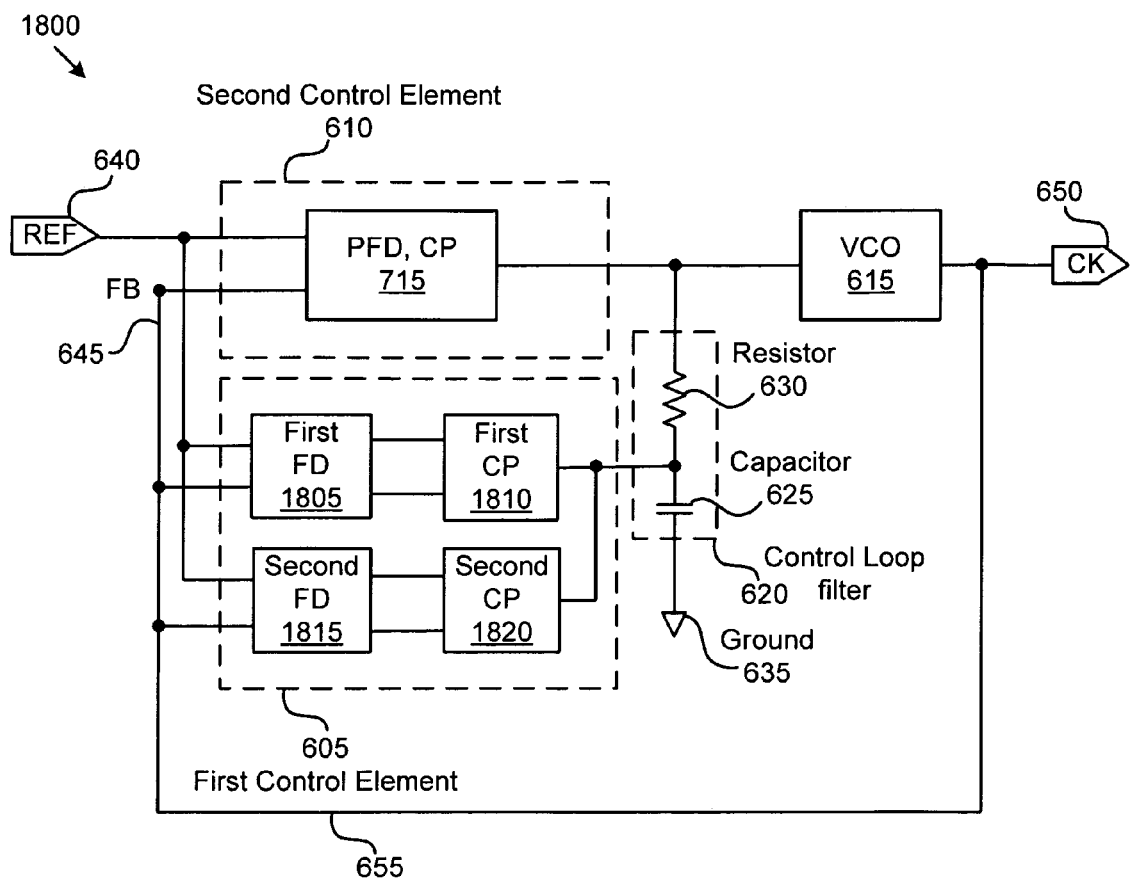
FIG. 18 illustrates a block diagram of an alternative embodiment of a fast lock PLL circuit incorporating a second frequency control element.

FIG. 18 illustrates a block diagram of an alternative embodiment of a fast lock PLL circuit 1800. In one embodiment, the first control element 605 may include a first frequency detector 1805, a first charge pump 1810, a second frequency detector 1815, and a second charge pump 1820. In such an embodiment, the first frequency detector 1805 and the first charge pump 1810 may form a first frequency control element configured for fine frequency adjustments. The second frequency detector 1815 and the second charge pump 1820 may form a second frequency control element configured for rapid or "course" frequency adjustments. In such an embodiment, the dead zone 825 of the second frequency detector 1815 may be wider than the dead zone 825 of the first frequency detector 1805, allowing the first frequency detector 1805 to make frequency adjustments within a closer range of the frequency of the reference signal 640.

Figure 19:
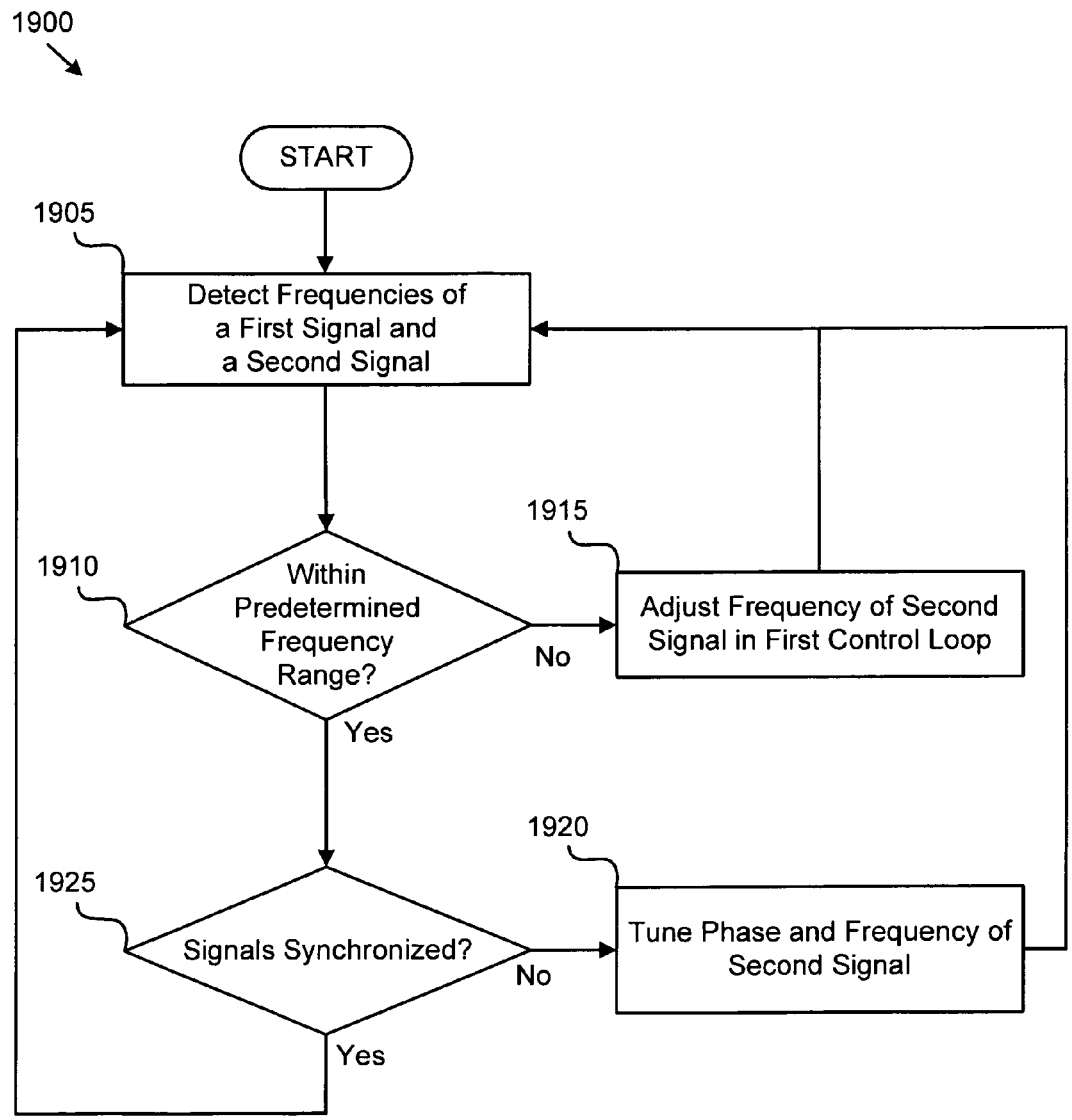
FIG. 19 illustrates a flow chart diagram of one embodiment of a method for fast locking signal frequencies and phases.

FIG. 19 illustrates a flow chart diagram of one embodiment of a method 1900 for fast locking signal frequencies and phases. In one embodiment, the method 1900 includes detecting 1905 the frequencies of a first signal and a second signal. The first control element 605 adjusts 1915 the frequency of the second signal in response to detecting a frequency difference and in response to a determination 1910 that the frequency of the second signal is outside a predetermined range (e.g., the dead zone 825) of the frequency of the first signal.

If it is determined 1910 that the frequency of the second signal is within a predetermined range (e.g., the dead zone 825) of the frequency of the first signal, then a determination is made whether the first signal and the second signal are synchronized, or phase- and frequency-locked. If the first signal and the second signal are not synchronized, then the second control element 610 tunes 1930 the phase and the frequency of the second signal. The second control element 610 may continue to tune 1930 the phase and the frequency of the second signal each clock cycle until a determination 1925 is made that the first signal and the second signal are synchronized, or phase- and frequency-locked. After the signals are synchronized, the PLL 410 keeps checking the second signal each clock cycle to ensure that the signals stay locked.

For example, a CDR Receiver 525 may include a fast locking PLL 410. The PLL 410 may receive a reference signal 640 from the reference clock source 520 and a transmitted signal for recovery from the data link 515. In such an example, the output of the PLL 410 is coupled to the feedback clock signal by a feedback connection 655. The first control element 605 may detect 1905 the frequencies of the reference signal 640 and the feedback clock signal. In an embodiment where the first control element 605 includes a symmetrical range controller 1000, the first control element 605 may adjust 1915 the frequency of the clock signal in response to a determination 1910 that the frequency of the clock signal is not within a predetermined range (e.g., the dead zone 825) of the reference signal 640 until it is determined 1910 that the frequency is within the predetermined range.

When it is determined 1910 that the frequency of the clock signal is within the dead zone 825, the second control element 610 may tune 1930 the phase and the frequency of the clock signal until it is determined 1925 that the signals are synchronized. The entire process then repeats from the start and the PLL 410 keeps checking the clock signal to monitor whether the clock signal stays synchronized.

Figure 20:
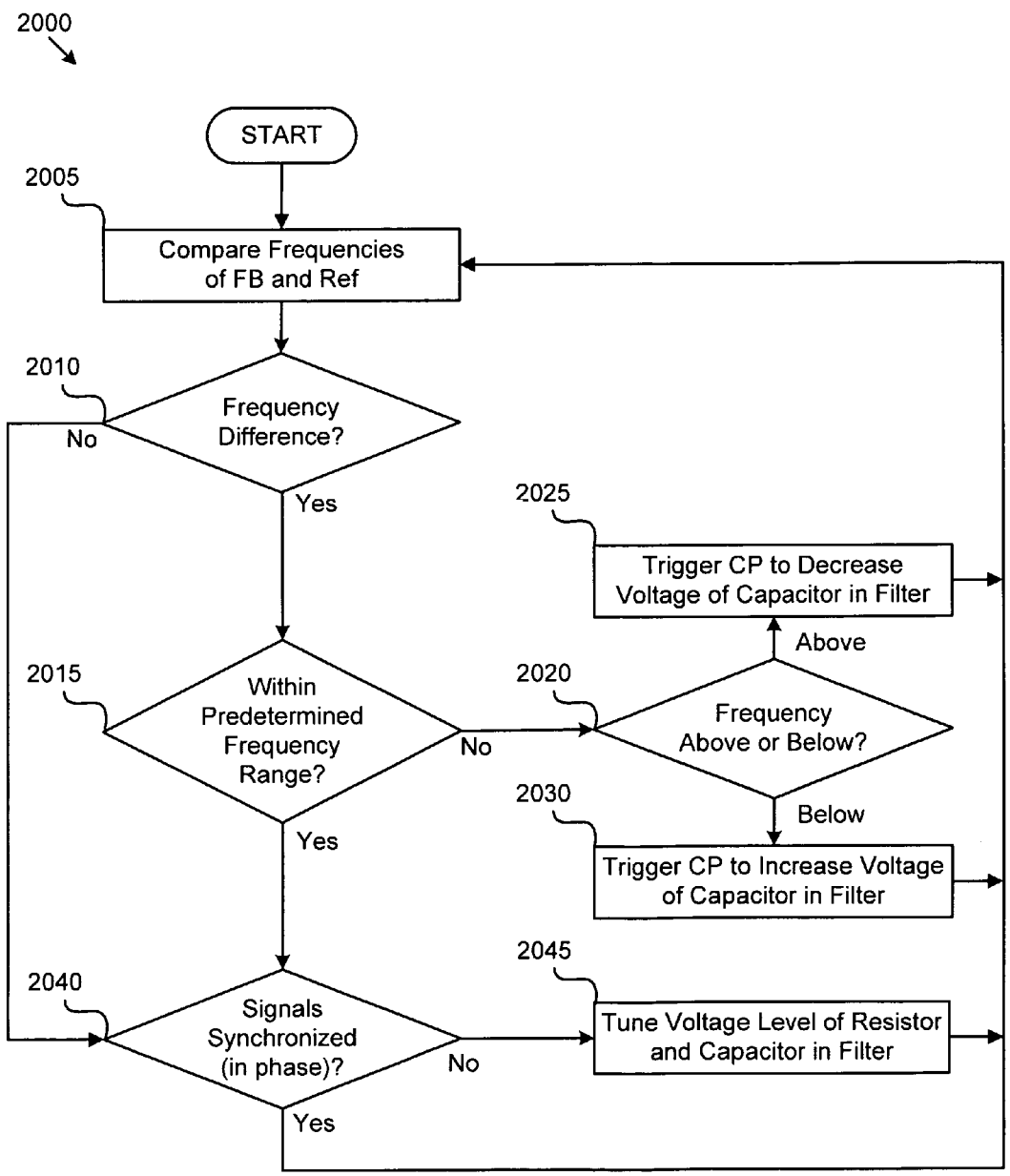
FIG. 20 illustrates a detailed flow chart diagram of one embodiment of a method for fast locking signal frequencies and phases.

FIG. 20 illustrates a detailed flow chart diagram of another embodiment of a method 2000 for fast locking signal frequencies and phases. In this embodiment, the PLL 410 compares 2005 the frequencies of the feedback signal 645 and the reference signal 640. If it is determined 2010 that there is a frequency difference and it is determined 2020 that the frequency of the feedback signal 645 is not within the dead zone 825, or within a predetermined range of the reference signal 640, the range controller 1000 may determine 2020 whether the frequency of the feedback signal 645 is above or below the frequency of the reference signal 640. If the frequency of the feedback signal 645 is above 2020 the frequency of the reference signal 640, the frequency detector 705 may signal 2025 the charge pump 710 to decrease the voltage of the capacitor 625 in the control loop filter 620. If the frequency of the feedback signal 645 is below 2020 the frequency of the reference signal 640, the frequency detector 705 may signal 2030 the charge pump 710 to increase the voltage of the capacitor 625 in the control loop filter 620. In one embodiment of the method 2000, this process repeats until it is determined 2015 that the frequency of the feedback signal 645 is within the predetermined range (e.g., the dead zone 825) of the reference signal 640.

In a further embodiment, if the frequency of the feedback signal 645 is within a predetermined range of the frequency of the reference signal 640, or if there is not a difference between the frequencies of the feedback signal 645 and the reference signal 640, then a determination 2040 is made as to whether the signals are synchronized (i.e., in phase). If the signals are not synchronized, then the combination device 715 may further tune 2045 the voltage level across both the resistor 630 and the capacitor 625. The tuning 2045 may continue each clock cycle until it is determined 2040 that the signals are synchronized. In one embodiment, the entire process then repeats from the start and the first control element 605 and the second control element 610 keep checking the clock signal to monitor whether the clock signal stays synchronized.

Figure 21:
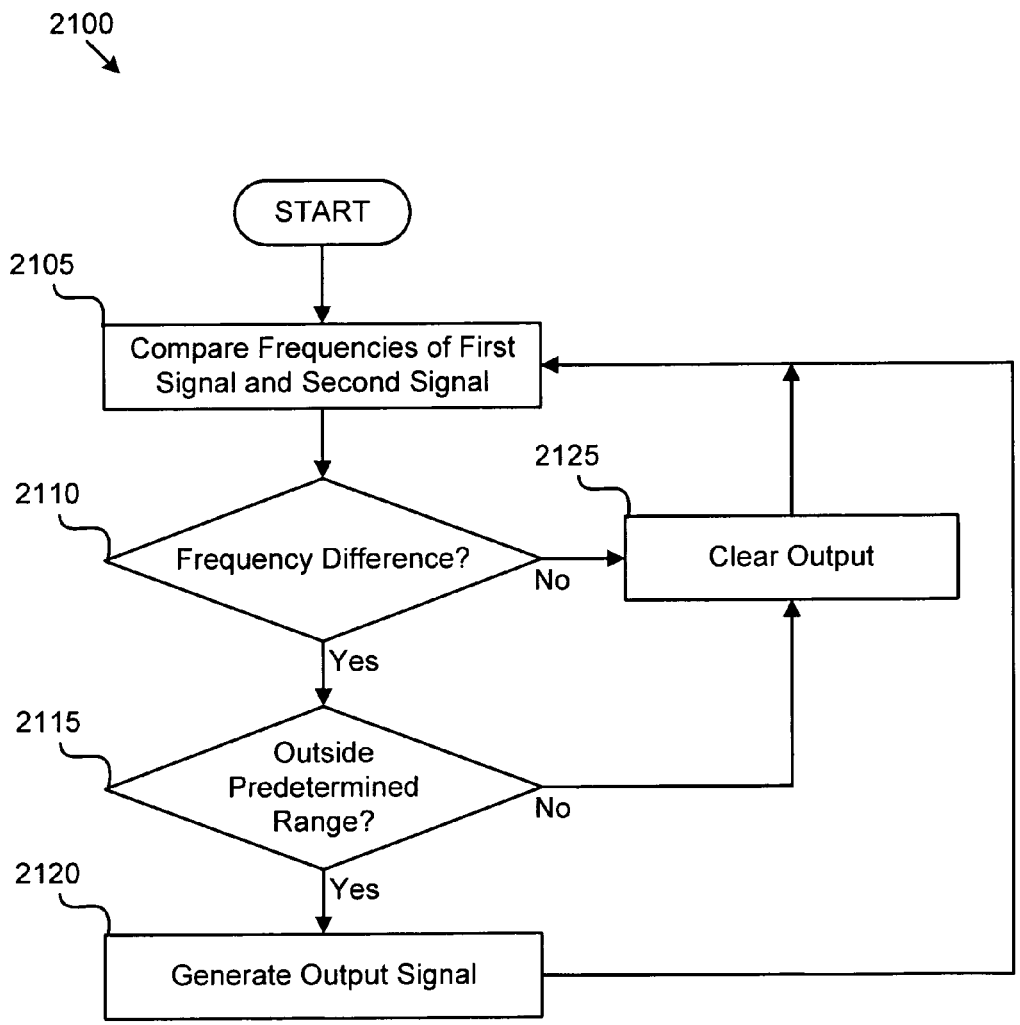
FIG. 21 illustrates a flow chart diagram of a method for implementing the range control function of a frequency detector.

FIG. 21 illustrates a flow chart diagram of a method 2100 for implementing the range control function of a frequency detector 705. In one embodiment, the symmetric range controller 1000 is configured to compare 2105 the frequency of a first signal and the frequency of a second signal. If it is determined 2110 that there is a frequency difference, and if it is determined 2115 that the frequency of the second signal is outside of a predetermined range (e.g., the dead zone 825) of the frequency of the first signal, the symmetric range controller 1000 may set 2120 an output signal. Otherwise the signal is cleared, if it had been set previously. In one embodiment, the output signal is an up output signal 1015. Alternatively, the output signal may be a down output signal 1020.

Figure 22:
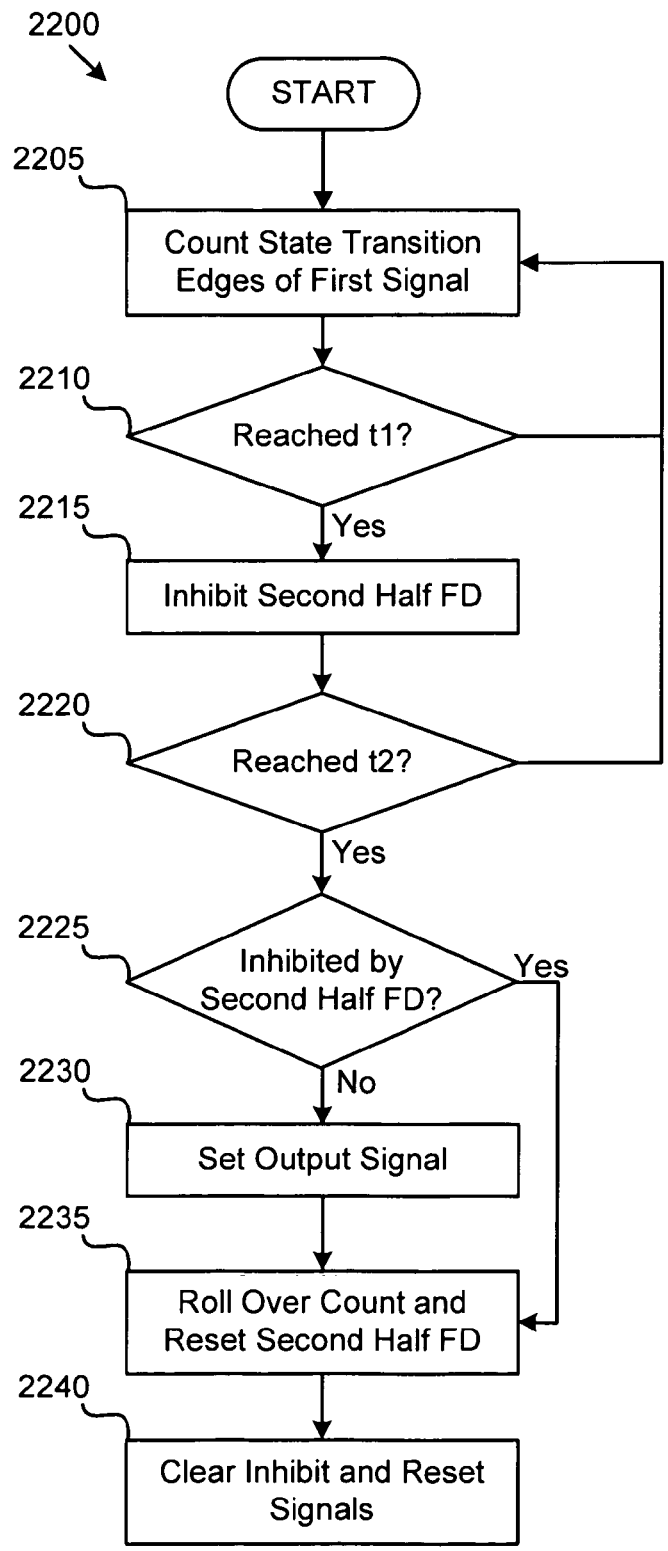
FIG. 22 illustrates a detailed flow chart diagram of a method for implementing the range control function of a frequency detector.

FIG. 22 illustrates a detailed flow chart diagram of a method for implementing the range control function of a frequency detector 705. In one embodiment, the frequency detector 705 includes a symmetrical range controller 1000. In particular, FIG. 22 is directed to operations 2200 which are associated with a first half frequency detector 1005. However, similar operations may be implemented in tandem by the first half frequency detector 1005 and the second half frequency detector 1010. In the case where similar operations are implemented by the second half frequency detector 1010, the references to the first and second half frequency detectors 1005 and 1010 would be reversed. Additionally, the references to up and down output signals may be reversed.

In one embodiment, the first half frequency detector 1005 counts 2205 state transition edges of the first signal. The second half frequency detector 1010 also counts state transition edges of the second signal. If the first half frequency detector 1005 reaches 2210 t1, the first half frequency detector 1005 may inhibit 2215 the second half frequency detector 1010. Alternatively, if the second half frequency detector 1010 reaches t1 before the first half frequency detector 1005 reaches 2220 t2, the second half frequency detector 1010 may inhibit the first half frequency detector 1005. Otherwise, if neither half frequency detector 1005 and 1010 reaches t1, then the half frequency detectors 1005 and 1010 continue to count state transition edges.

When the first half frequency detector 1005 reaches 2220 t2, and if it is determined 2225 that the first half frequency detector 1005 has not been inhibited by the second half frequency detector 1010, and the second clock signal has been detected in one embodiment, the first half frequency detector 1005 may assert 2230 an up output signal 1015. Alternatively, if the second half frequency detector 1010 reaches t2, and if it is determined that the second half frequency detector 1010 has not been inhibited 2215 by the first half frequency detector 1005, and the first clock signal has been detected in one embodiment, the second half frequency detector 1010 may assert a down output signal 1020. Otherwise, if the half frequency detectors 1005 and 1010 have not reached t2, then the half frequency detectors 1005 and 1010 continue to count state transition edges.

If the first half frequency detector 1005 reaches 2220 t2, the counter 1125 may roll 2235 over the count after a short wait period, and reset 2235 the second half frequency detector 1010. Additionally, the first half frequency detector 1005 may clear 2240 any set inhibit and reset signals [In practice, the inhibit and reset signals are cleared directly by the counterpart half]. In one embodiment, the first half frequency detector 1005 may wait for confirmation from the second half frequency detector 1010 that the second half frequency detector 1010 has be reset before the first half frequency detector 1005 clears 2240 any set inhibit and reset signals. In another embodiment, the second half frequency detector 1010 may assert a clear signal to clear 2240 the inhibit and reset signals.

Likewise, if the second half frequency detector 1010 reaches t2, the counter 1125 may roll over the count after a short wait period, and reset the first half frequency detector 1005. Additionally, the second half frequency detector 1010 may clear any set inhibit and reset signals. In one embodiment, the second half frequency detector 1010 may wait for confirmation from the first half frequency detector 1005 that the first half frequency detector 1005 has be reset before the second half frequency detector 1010 clears any set inhibit and reset signals. Alternatively, the first half frequency detector 1005 may assert a clear signal to clear the inhibit and reset signals.

Another Embodiment

In a further embodiment, a circuit improves the application of a fast lock circuit to a Clock and Data Recovery (CDR) Phase-Locked Loop (PLL). Even though the original circuit may lend itself to application in a CDR PLL, another embodiment of the circuit may yield better results if the datarate is much higher than the (local) reference frequency.

Figure 23:
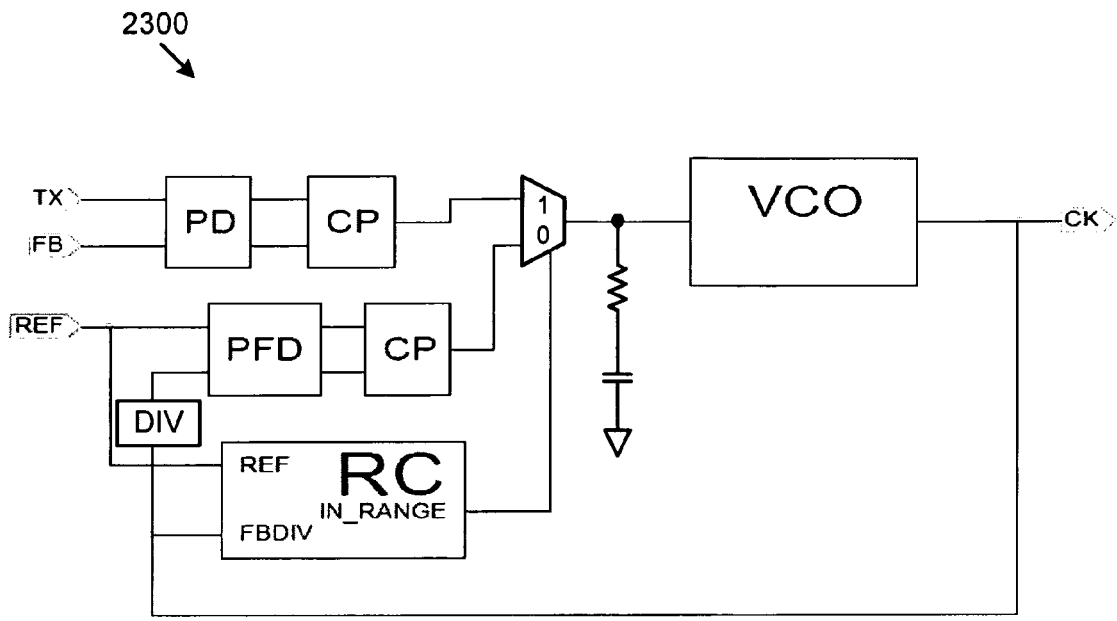
FIG. 23 illustrates one embodiment of a simplified block diagram of the architecture of a generic CDR PLL.

For the purpose of providing a frame of reference for an exemplary description of the improved circuit, a simplified block diagram of the architecture of a generic CDR PLL 2300 of the type that might be implemented is shown in FIG. 23. The illustrated multiplexor (mux) is really a conceptual construct to denote an analog switch that switches between the PD and PFD. Each of the components may functions as described above. Actual implementations may differ from what is shown.

The original FD circuit detects the frequency difference by counting at the reference clockrate. This is illustrated by the embodiment of the circuit 2400 shown in FIG. 24. Note the way the FD is connected in the circuit. The FD is shown as always active, but in some embodiments may be disabled by a lock detect circuit, as described above. In some embodiments, the divider may be optional.

Figure 24:
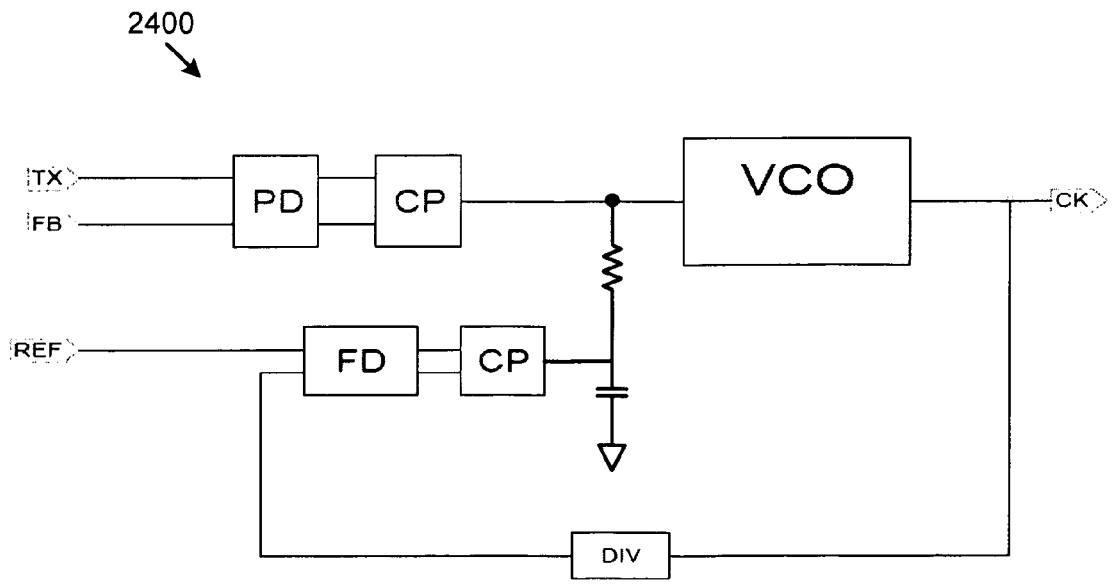
FIG. 24 illustrates one embodiment of a block architecture of a CDR PLL with an active Frequency Detector (FD).

Since the datarate in a CDR PLL is usually much higher (usually at least 10×) than the reference, the circuit shown in FIG. 24 may represent a sub-optimal scenario in the sense that to count to the required accuracy to be able to detect frequencies close enough to the data rate (within the PLL bandwidth) may take a relatively long time. For example, counting to the required accuracy may take longer than counting at the datarate. However, it may be difficult or even impossible to use a symmetrical range controller to count at the datarate since the transmitted datastream does not necessarily have a transition in every clock cycle. This may apply even if an asynchronous transition detector can be designed that can operate at the datarate.

Figure 25:
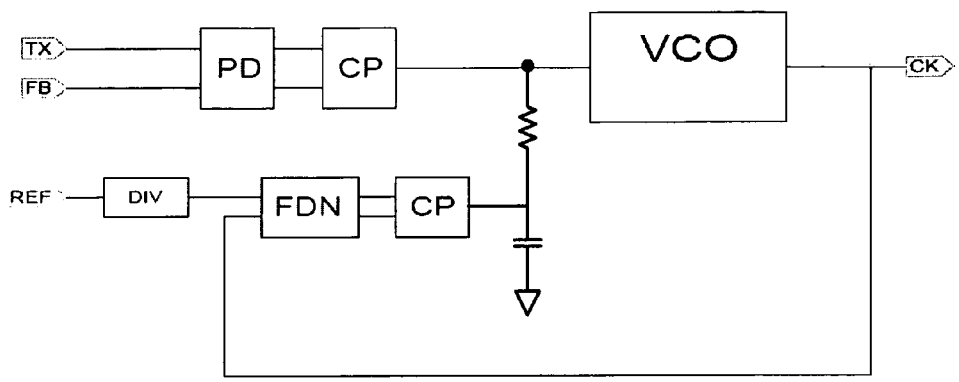
FIG. 25 illustrates one embodiment of a modified frequency detector (FDN) connected in the CDR PLL.

FIG. 25 illustrates one embodiment of a modified frequency detector (FDN) connected in the CDR PLL 2500. In some embodiments, the divider (DIV) in the reference path is optional. In this case, the frequency detector FDN counts at the datarate.

Figure 26:
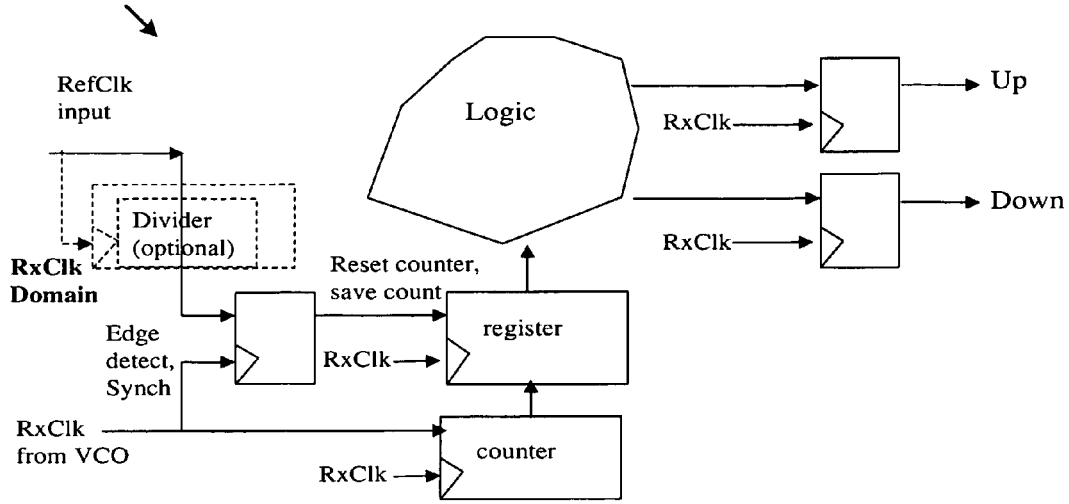
FIG. 26 illustrates one embodiment of a range controller to implement the modified frequency detector (FDN) of FIG. 25.

Also, the FDN and CP in FIG. 25 form a second, parallel control loop. The frequency detector FDN may also be called a range controller 2600 and, in one embodiment, may be implemented as shown in FIG. 26. In the illustrated embodiment, a counter counts RxCLK transitions until the signal derived from RefCLK loads the count value into the register and resets the counter. Nominally (when the RxCLK is equal to the datarate), this value should be equal to the value used in the feedback divider (the ratio of RxCLK to RefCLK), if the feedforward (optional) divider is not used. If the optional divider is used, the nominal value is multiplied by the value used in the divider. The circuit is synchronous to the RxCLK domain.

Figure 27:
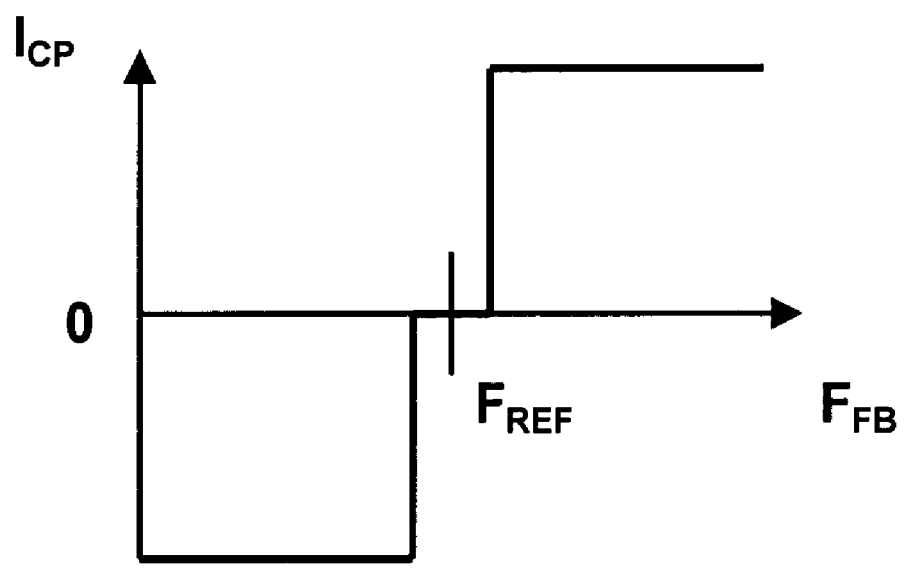
FIG. 27 illustrates one embodiment of a FD frequency characteristic resulting from the embodiments of FIGS. 25 and 26.

The "dead" zone (or "deadzone") is implemented by the section denoted "Logic" in FIG. 26. In one embodiment, the deadzone is smaller than the bandwidth of the PLL. The resulting FD frequency characteristic 2700 is shown in FIG. 27. In order to facilitate operation of the range controller in this manner, the range controller be configured to detect the sign of the frequency difference, not just an "out of range" condition. Therefore, in contrast to the normal application of a range controller, where the "out of range" indication is used to switch in a Phase Frequency Detector (PFD), in this application a range controller is used to replace the PFD in obtaining lock, as long as the deadzone range is within the bandwidth of the loop. In one embodiment, this modification improves on the application of the fast lock circuit to CDR PLLs, allowing for quicker and/or more accurate detection of the frequency. Other embodiments also may be implemented.

Embodiments of the present invention, described herein, include various operations. These operations may be performed by hardware components, software, firmware, or a combination thereof. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a machine-readable medium. These instructions may be used to program a general-purpose or special-purpose processor to perform the described operations. A machine-readable medium includes any mechanism for storing or transmitting information in a form (e.g., software, processing application) readable by a machine (e.g., a computer). The machine-readable medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory; electrical, optical, acoustical, or other form of propagated signal (e.g., carrier waves, infrared signals, digital signals, etc.); or another type of medium suitable for storing electronic instructions.

Additionally, some embodiments may be practiced in distributed computing environments where the machine-readable medium is stored on and/or executed by more than one computer system. In addition, the information transferred between computer systems may either be pulled or pushed across the communication medium connecting the computer systems.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:
1. An apparatus, comprising:
a first counter coupled to a first signal line, the first counter configured to count state transition edges of the first signal;

inhibit logic coupled to the first counter, the inhibit logic configured to inhibit an output signal of a second counter in response to a predetermined count of the first counter; and reset logic coupled to the first counter, the reset logic configured to reset the second counter in response to a full count of the first counter.

2. The apparatus of claim 1, wherein the first counter is further configured to generate an output signal in response to the full count of the first counter and a determination that the output signal is not inhibited.

3. The apparatus of claim 2, further comprising disable logic coupled to a first signal line, a second signal line, and the first and second counters, the disable logic configured to disable both counters upon detection of synchronization of a first frequency and phase of the first signal with a second frequency and phase of the second signal.

4. The apparatus of claim 3, further comprising detect logic coupled to the first signal line, the second signal line, and the first counter, the detect logic configured to detect the presence of the second signal prior to generation of the first output signal, wherein the first output signal is generated in response to a determination that the second signal is present.

5. The apparatus of claim 1, further comprising clear logic coupled to the first counter, the clear logic configured to clear previously set inhibit signals and reset signals of the first counter in conjunction with a counter reset operation of the second counter.

6. The apparatus of claim 1, wherein the first counter further comprises a fixed word-length counter, wherein the word-length corresponds to a predetermined sampling rate.

7. The apparatus of claim 1, further comprising range logic coupled to a bit state signal output of the first counter, wherein the range logic is configured to determine a number of counts to be reached before generation of a first inhibit signal.

* * * * *